United States Patent
Wang et al.

(10) Patent No.: US 12,374,624 B2
(45) Date of Patent: *Jul. 29, 2025

(54) SEMICONDUCTOR DEVICES

(71) Applicant: Taiwan Semiconductor Manufacturing Co., Ltd., Hsinchu (TW)

(72) Inventors: Pei-Yu Wang, Hsinchu (TW); Yu-Xuan Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/633,002

(22) Filed: Apr. 11, 2024

(65) Prior Publication Data
US 2024/0258237 A1     Aug. 1, 2024

Related U.S. Application Data

(63) Continuation of application No. 17/870,531, filed on Jul. 21, 2022, now Pat. No. 11,984,402, which is a (Continued)

(51) Int. Cl.
*H01L 23/528*     (2006.01)
*H01L 21/02*     (2006.01)
(Continued)

(52) U.S. Cl.
CPC .... *H01L 23/5286* (2013.01); *H01L 21/02603* (2013.01); *H01L 21/28518* (2013.01);
(Continued)

(58) Field of Classification Search
CPC ........... H01L 23/5286; H01L 21/02603; H01L 21/28518; H01L 21/31116; H01L 21/31144; H01L 29/0673; H01L 29/41733; H01L 29/42392; H01L 29/45; H01L 29/66545; H01L 29/66553;
(Continued)

(56) References Cited

U.S. PATENT DOCUMENTS 9,209,247 B2   12/2015   Colinge et al.
9,236,267 B2   1/2016   De et al.
(Continued)

FOREIGN PATENT DOCUMENTS

KR   20180117018 A   10/2018
KR   20180131346 A   12/2018
(Continued)

*Primary Examiner* — Tong-Ho Kim
(74) *Attorney, Agent, or Firm* — Slater Matsil, LLP

(57) ABSTRACT

In an embodiment, a device includes: a first fin; a gate structure over the first fin; a first source/drain region adjacent the gate structure; an etch stop layer over the first source/drain region; a conductive line over the etch stop layer, the conductive line isolated from the first source/drain region by the etch stop layer, a top surface of the conductive line being coplanar with a top surface of the gate structure; and a power rail contact extending through the first fin, the power rail contact connected to the first source/drain region.

20 Claims, 46 Drawing Sheets

Related U.S. Application Data continuation of application No. 17/015,628, filed on Sep. 9, 2020, now Pat. No. 11,410,930.

(60) Provisional application No. 63/016,505, filed on Apr. 28, 2020.

(51) Int. Cl.

| | | |
|---|---|---|
| *H01L 21/285* | (2006.01) | |
| *H01L 21/311* | (2006.01) | |
| *H01L 29/06* | (2006.01) | |
| *H01L 29/417* | (2006.01) | |
| *H01L 29/423* | (2006.01) | |
| *H01L 29/45* | (2006.01) | |
| *H01L 29/66* | (2006.01) | |
| *H01L 29/78* | (2006.01) | |
| *H01L 29/786* | (2006.01) | |
| *H10D 30/01* | (2025.01) | |
| *H10D 30/67* | (2025.01) | |
| *H10D 30/69* | (2025.01) | |
| *H10D 62/00* | (2025.01) | |
| *H10D 62/10* | (2025.01) | |
| *H10D 64/01* | (2025.01) | |
| *H10D 64/62* | (2025.01) | |

(52) U.S. Cl.
CPC .. *H01L 21/31116* (2013.01); *H01L 21/31144* (2013.01); *H10D 30/031* (2025.01); *H10D 30/6713* (2025.01); *H10D 30/6729* (2025.01); *H10D 30/6735* (2025.01); *H10D 30/6757* (2025.01); *H10D 30/797* (2025.01); *H10D 62/021* (2025.01); *H10D 62/121* (2025.01); *H10D 64/017* (2025.01); *H10D 64/018* (2025.01); *H10D 64/62* (2025.01)

(58) Field of Classification Search
CPC ......... H01L 29/66636; H01L 29/66742; H01L 29/7848; H01L 29/78618; H01L 29/78696; H01L 29/41725; H01L 23/485; H01L 29/401; H01L 29/4175; H01L 29/66439; H01L 29/165; H01L 29/775; H01L 27/0924; H01L 21/823821; H01L 21/823871; B82Y 10/00
USPC .......................................................... 257/347
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 10,269,621 | B2 | 4/2019 | Wang et al. |
| 10,734,412 | B2 | 8/2020 | Glass et al. |
| 11,024,550 | B2 | 6/2021 | Liao et al. |
| 11,205,597 | B2 | 12/2021 | Tan et al. |
| 11,410,930 | B2 | 8/2022 | Wang et al. |
| 11,984,402 | B2 * | 5/2024 | Wang ................ H01L 29/78618 |
| 2002/0190316 | A1 | 12/2002 | Kwean et al. |
| 2013/0161707 | A1 | 6/2013 | Huang et al. |
| 2016/0343708 | A1 | 11/2016 | Park et al. |
| 2017/0133274 | A1 | 5/2017 | Lu et al. |
| 2019/0088542 | A1 | 3/2019 | Hsieh et al. |
| 2019/0164882 | A1 | 5/2019 | Chen et al. |
| 2019/0164957 | A1 | 5/2019 | Meng et al. |
| 2019/0259699 | A1 | 8/2019 | Morrow et al. |
| 2019/0355716 | A1 | 11/2019 | Meng et al. |
| 2020/0006228 | A1 | 1/2020 | Yang et al. |
| 2020/0035560 | A1 | 1/2020 | Block et al. |
| 2020/0126798 | A1 * | 4/2020 | Lin .................. H01L 29/78618 |
| 2020/0135932 | A1 * | 4/2020 | Wang ................ H01L 29/78696 |
| 2020/0365509 | A1 * | 11/2020 | Sasaki ............... H01L 21/76898 |

FOREIGN PATENT DOCUMENTS

| | | |
|---|---|---|
| KR | 20190015269 A | 2/2019 |
| KR | 20200020631 A | 2/2020 |
| KR | 20200037110 A | 4/2020 |

* cited by examiner

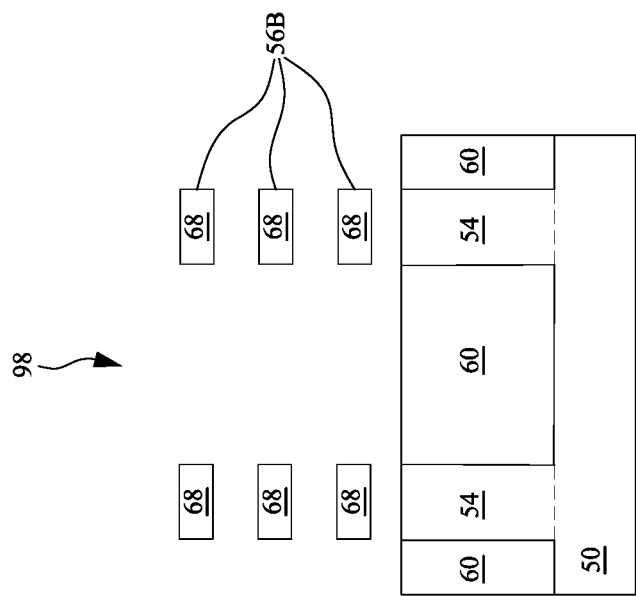

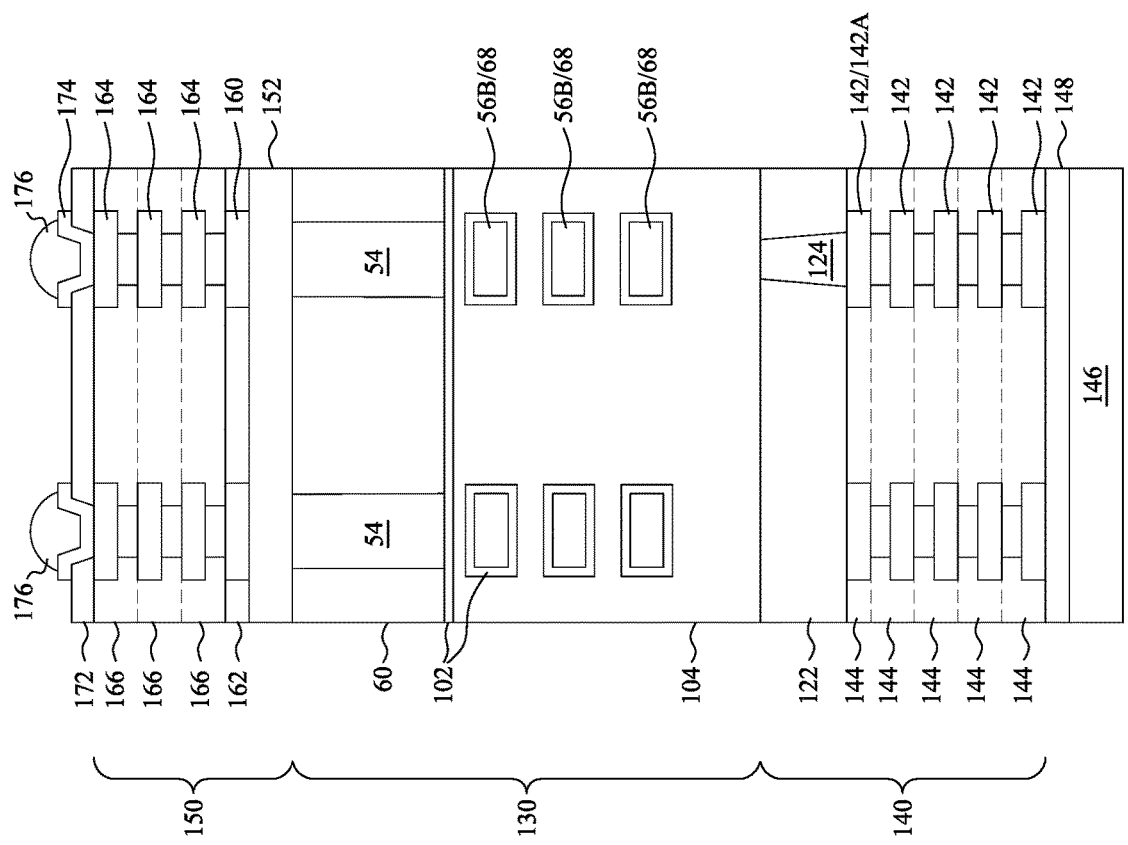

SEMICONDUCTOR DEVICES

PRIORITY CLAIM AND CROSS-REFERENCE

This application is a continuation of U.S. application Ser. No. 17/870,531, filed on Jul. 21, 2022, entitled "Semiconductor Device and Method," which is a continuation of U.S. application Ser. No. 17/015,628, filed on Sep. 9, 2020, entitled "Semiconductor Device and Method," now U.S. Pat. No. 11,410,930, issued on Aug. 9, 2022, which claims the benefit of U.S. Provisional Application No. 63/016,505, filed on Apr. 28, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 28A through 28D are various views of semiconductor devices, in accordance with some other embodiments.

DETAILED DESCRIPTION

Figure 1:
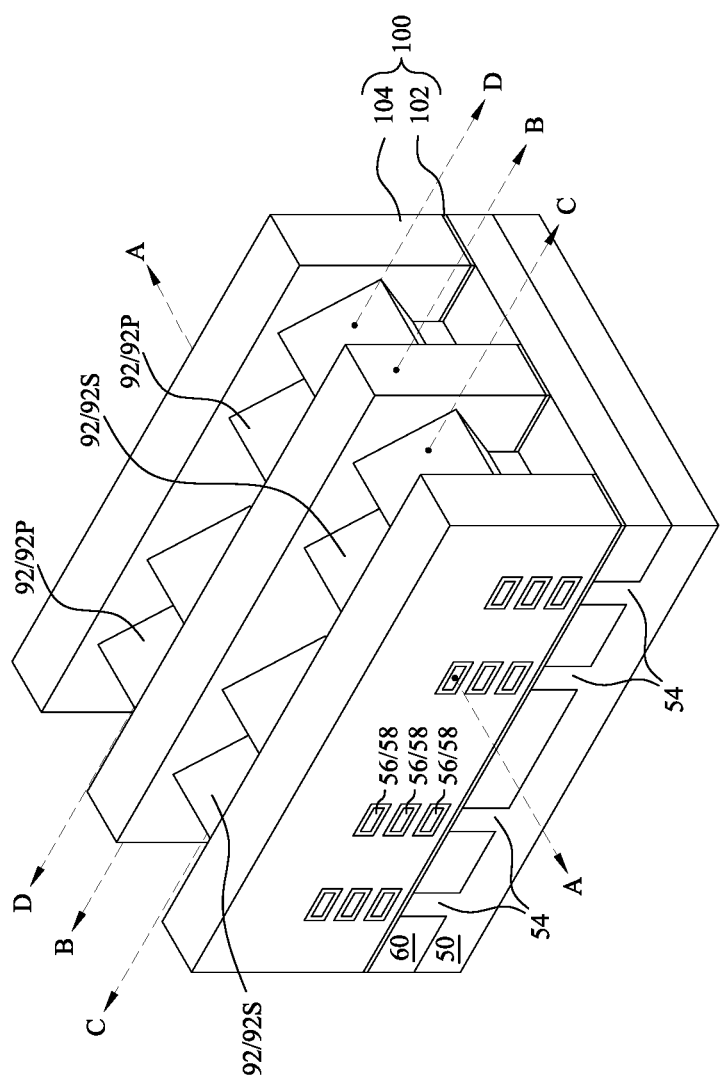
FIG. 1 illustrates an example of simplified nanostructure field effect transistors (nano-FETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a semiconductor device is formed having a device layer disposed between two interconnect structures. The device layer includes transistors, e.g., nanostructure field effect transistors (nano-FETs). One of the interconnect structures is at the front-side of the device layer, and includes conductive features that interconnect the transistors of the device layer to form functional circuits. The other of the interconnect structures is at the back-side of the device layer, and includes conductive features that are used to provide power circuits for the device layer. Specifically, the back-side interconnect structure includes dedicated power rails for providing a reference voltage, supply voltage, or the like to the functional circuits. The power rails are attached to the back-sides of source/drain regions of the transistors in the device layer. As such, contacts to the front-sides of such source/drain regions are undesired and are not formed. Avoiding the formation of such contacts can increase the performance of the transistors and frees up room in the device layer, which may be used for other purposes, such as the formation of additional conductive lines for interconnect routing.

FIG. 1 illustrates an example of simplified nano-FETs, in accordance with some embodiments. FIG. 1 is a cutaway three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 56 over a substrate 50, such as over fins 54 extending from the substrate 50. The nanostructures 56 are semiconductor layers that act as channel regions 68 for the nano-FETs. Isolation regions 60, such as shallow trench isolation (STI) regions, are disposed over the substrate 50 and between adjacent ones of the fins 54, which may protrude above and from between neighboring isolation regions 60. Although the isolation regions 60 are described/illustrated as being separate from the substrate 50, as used herein, the term "substrate" may refer to the substrate 50 alone or a combination of the substrate 50 and the isolation regions 60. Additionally, although the fins 54 are illustrated as single, continuous materials with the substrate 50, the fins 54 and/or the substrate 50 may include a single material or a plurality of materials. In this context, the fins 54 refer to the portion extending above and from between the neighboring isolation regions 60.

Gate structures 100 are wrapped around the nanostructures 56 and disposed over the fins 54. The gate structures 100 include gate dielectrics 102 and gate electrodes 104. The gate dielectrics 102 are along top surfaces, sidewalls, and bottom surfaces of the nanostructures 56 and may extend along sidewalls and/or over top surfaces of the fins 54. The gate electrodes 104 are on the gate dielectrics 102. Epitaxial source/drain regions 92 are disposed on opposite sides of the gate structures 100. In embodiments where multiple transistors are formed, the epitaxial source/drain regions 92 may be shared between various transistors. For example, neighboring epitaxial source/drain regions 92 may be electrically coupled, such as through coalescing the epitaxial source/drain regions 92 by epitaxial growth, or through coupling the epitaxial source/drain regions 92 with a same source/drain contact. One or more interlayer dielectric (ILD) layer(s) (discussed in greater detail below) are over the epitaxial source/drain regions 92 and/or the gate structures 100, through which contacts (discussed in greater detail below) to the epitaxial source/drain regions 92 and the gate electrodes 104 are formed. The epitaxial source/drain regions 92 and the gate electrodes 104 are interconnected to form functional circuits. As will be discussed in greater detail below, a first subset of the epitaxial source/drain regions 92P will be connected to dedicated power rails for providing a reference voltage, supply voltage, or the like to the circuits, and a second subset of the epitaxial source/drain regions 92S will not be connected to the dedicated power rails.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs).

FIG. 1 further illustrates reference a cross-section that is used in later figures. Cross-section A-A is along a longitudinal axis of a nanostructure 56 and in a direction, for example, of current flow between the epitaxial source/drain regions 92. Cross-section B-B is perpendicular to cross-section A-A and is along a longitudinal axis of a gate structure 100. Cross-section C-C is perpendicular to cross-section A-A and extends through the epitaxial source/drain regions 92S. Cross-section D-D is perpendicular to cross-section A-A and extends through the epitaxial source/drain regions 92P. Subsequent figures refer to this reference cross-section for clarity.

FIGS. 2 through 19D are various views of intermediate stages in the manufacturing of semiconductor devices, in accordance with some embodiments. Specifically, the manufacturing of a device layer of nano-FETs is illustrated. FIGS. 2, 3, 4, 5, and 6 are three-dimensional views showing a similar three-dimensional view as FIG. 1. FIGS. 7A, 8A, 9A, 10A, 11A, 12A, 13A, 14A, 15A, 16A, 17A, and 19A are cross-sectional views illustrated along reference cross-section A-A in FIG. 1. FIGS. 10B, 11B, 13B, and 19B are cross-sectional views illustrated along reference cross-section B-B in FIG. 1. FIGS. 7B, 8B, 9B, and 9C are cross-sectional views illustrated along either of reference cross-sections C-C or D-D in FIG. 1, except two fins are shown. FIGS. 14B, 15B, 16B, 17B, and 19C are cross-sectional views illustrated along reference cross-section C-C in FIG. 1, except two fins are shown. FIGS. 14C, 15C, 16C, 17C, and 19D are cross-sectional views illustrated along reference cross-section D-D in FIG. 1, except two fins are shown. FIG. 18 is a top-down view.

Figure 2:
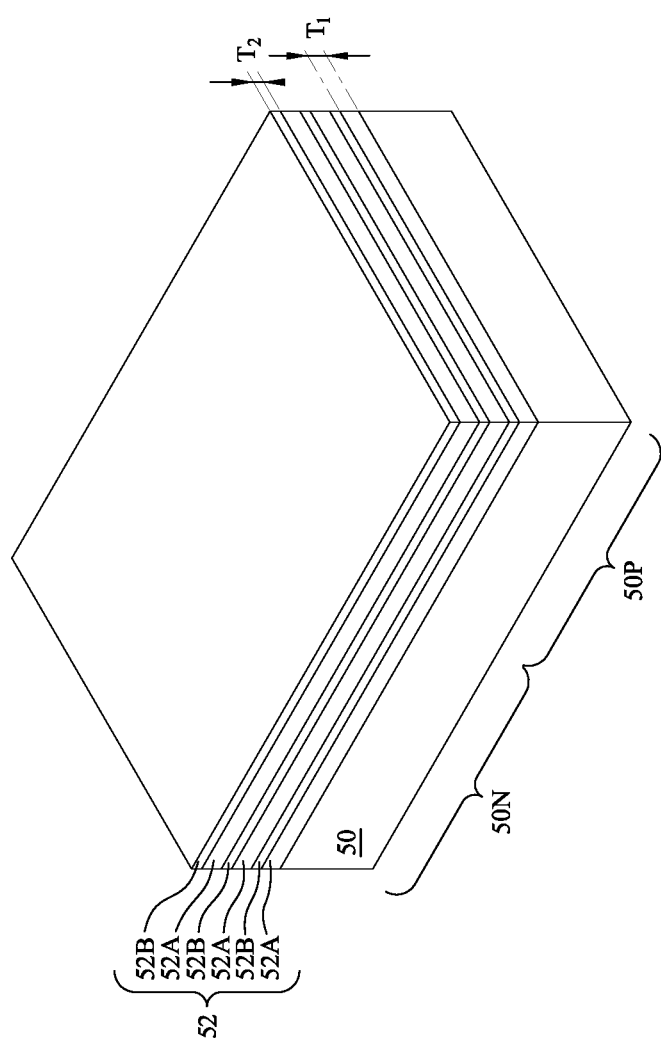
FIGS. 2 through 19D are various views of intermediate stages in the manufacturing of semiconductor devices, in accordance with some embodiments.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P.

The substrate 50 may be lightly doped with a p-type or an n-type impurity. An anti-punch-through (APT) implantation may be performed on an upper portion of the substrate 50 to form an APT region. During the APT implantation, dopants may be implanted in the n-type region 50N and the p-type region 50P. The dopants may have a conductivity type opposite from a conductivity type of source/drain regions that will be subsequently formed in each of the n-type region 50N and the p-type region 50P. The APT region may extend under subsequently formed source/drain regions in the nano-FETs, which will be formed in subsequent processes. The APT region may be used to reduce the leakage from the source/drain regions to the substrate 50. In some embodiments, the doping concentration in the APT region may be in the range of about $10^{18}$ cm$^{-3}$ to about $10^{19}$ cm$^{-3}$.

A multi-layer stack 52 is formed over the substrate 50. The multi-layer stack 52 includes alternating first semiconductor layers 52A and second semiconductor layers 52B. The first semiconductor layers 52A are formed of a first semiconductor material, and the second semiconductor layers 52B are formed of a second semiconductor material. The semiconductor materials may each be selected from the candidate semiconductor materials of the substrate 50. In the illustrated embodiment, the multi-layer stack 52 includes three layers of each of the first semiconductor layers 52A and the second semiconductor layers 52B. It should be appreciated that the multi-layer stack 52 may include any number of the first semiconductor layers 52A and the second semiconductor layers 52B.

In the illustrated embodiment, the second semiconductor layers 52B will be used to form channel regions for the nano-FETs in both the n-type region 50N and the p-type region 50P. The first semiconductor layers 52A are sacrificial layers (or dummy layers), which will be removed in subsequent processing to expose the top surfaces and the bottom surfaces of the second semiconductor layers 52B in both regions. The second semiconductor material of the second semiconductor layers 52B is a material suitable for both n-type and p-type nano-FETs, such as silicon, and the first semiconductor material of the first semiconductor layers 52A is a material that has a high etching selectivity from the etching of the second semiconductor material, such as silicon germanium.

In another embodiment, the first semiconductor layers 52A will be used to form channel regions for the nano-FETs in one region (e.g., the p-type region 50P), and the second semiconductor layers 52B will be used to form channel regions for the nano-FETs in another region (e.g., the n-type region 50N). The first semiconductor material of the first semiconductor layers 52A may be suitable for p-type nano-FETs, such as silicon germanium (e.g., $Si_xGe_{1-x}$, where x can be in the range of 0 to 1), pure or substantially pure germanium, a III-V compound semiconductor, a II-VI compound semiconductor, or the like, and the second semiconductor material of the second semiconductor layers 52B may be suitable for n-type nano-FETs, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 52A may be removed without removing the second semiconductor layers 52B in the n-type region 50N, and the second semiconductor layers 52B may be removed without removing the first semiconductor layers 52A in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may be formed to a small thickness, such as a thickness in a range of about 5 nm to about 30 nm. In some embodiments, one group of layers (e.g., the second semiconductor layers 52B) is formed to be thinner than another group of layers (e.g., the first semiconductor layers 52A). For example, in embodiments where the first semiconductor layers 52A are sacrificial layers (or dummy layers) and the second semiconductor layers 52B are used to form channel regions, the first semiconductor layers 52A can be formed to a first thickness $T_1$ and the second semiconductor layers 52B can be formed to a second thickness $T_2$, with the second thickness $T_2$ being from about 30% to about 60% less than the first thickness $T_1$. Forming the second semiconductor layers 52B to a smaller thickness allows the channel regions to be formed at a greater density.

Figure 3:
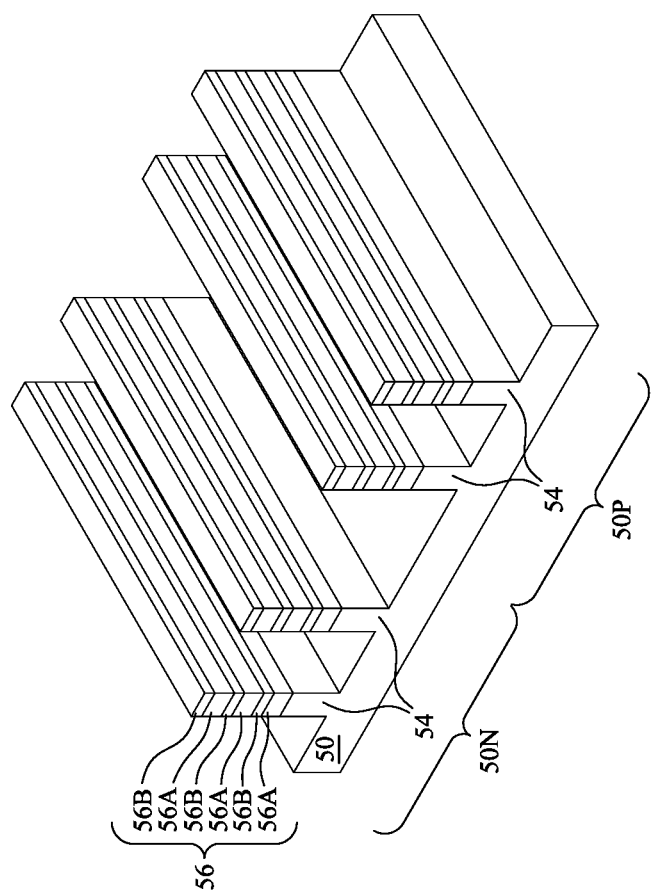

In FIG. 3, trenches are etched in the substrate 50 and the multi-layer stack 52 to form fins 54 and nanostructures 56. The fins 54 are semiconductor strips patterned in the substrate 50. The nanostructures 56 include the remaining portions of the multi-layer stack 52 on the fins 54. Specifically, the nanostructures 56 include alternating first nanostructures 56A and second nanostructures 56B. The first nanostructures 56A and the second nanostructures 56B are formed of remaining portions of the first semiconductor layers 52A and the second semiconductor layers 52B, respectively. After formation, the second nanostructures 56B in the intermediate levels of the structure are each disposed between two of the first nanostructures 56A. The etching may be any acceptable etch process, such as a reactive ion etch (RIE), neutral beam etch (NBE), the like, or a combination thereof. The etching may be anisotropic.

The fins 54 and the nanostructures 56 may be patterned by any suitable method. For example, the fins 54 and the nanostructures 56 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 54 and the nanostructures 56.

The fins 54 and the nanostructures 56 may have widths in a range of about 8 nm to about 40 nm. The fins 54 and the nanostructures 56 in the n-type region 50N and the p-type region 50P are illustrated as having substantially equal widths for illustrative purposes. In some embodiments, the fins 54 and the nanostructures 56 in one region (e.g., the n-type region 50N) may be wider or narrower than the fins 54 and the nanostructures 56 in the other region (e.g., the p-type region 50P).

Figure 4:
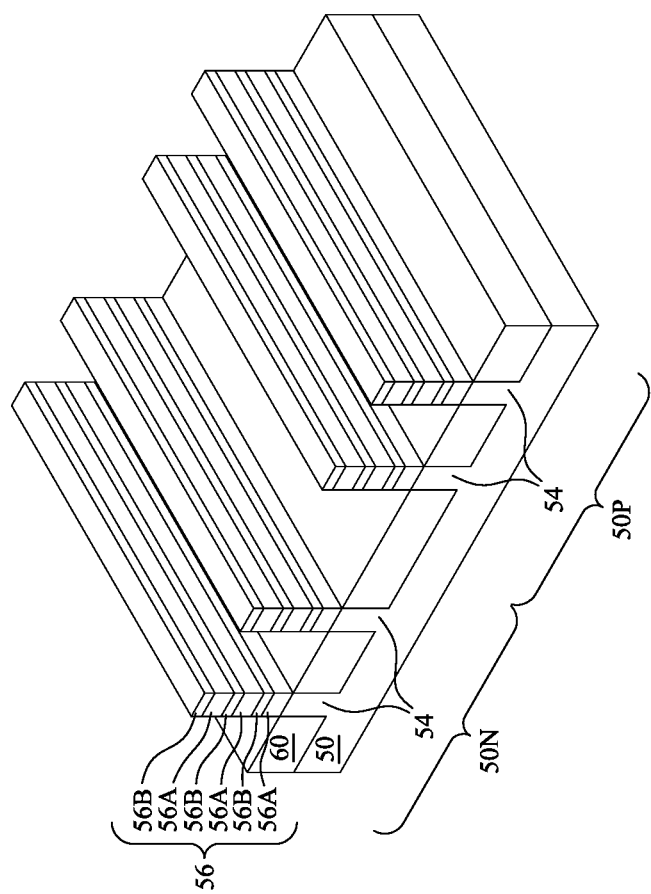

In FIG. 4, STI regions 60 are formed adjacent the fins 54. The STI regions 60 may be formed by depositing an insulation material over the substrate 50 and the nanostructures 56, and between adjacent ones of the fins 54. The insulation material may be an oxide such as silicon oxide, a nitride such as silicon nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 56. Although the insulation material is illustrated as a single layer, some embodiments may utilize multiple layers. For example, in some embodiments a liner may first be formed along surfaces of the substrate 50, the fins 54, and the nanostructures 56. Thereafter, a fill material, such as those discussed above may be formed over the liner.

A removal process is then applied to the insulation material to remove excess insulation material over the nanostructures 56. In some embodiments, a planarization process such as a chemical mechanical polish (CMP), an etch-back process, combinations thereof, or the like may be utilized. The planarization process exposes the nanostructures 56 such that top surfaces of, respectively, the nanostructures 56 and the insulation material are coplanar (within process variations) after the planarization process is complete.

The insulation material is then recessed to form the STI regions 60. The insulation material is recessed such that at least a portion of the nanostructures 56 protrude from between neighboring STI regions 60. In the illustrated embodiment, the top surfaces of the STI regions 60 are coplanar (within process variations) with the top surfaces of the fins 54. In some embodiments, the top surfaces of the STI regions 60 are above or below the top surfaces of the fins 54. Further, the top surfaces of the STI regions 60 may have a flat surface as illustrated, a convex surface, a concave surface (such as dishing), or a combination thereof. The top surfaces of the STI regions 60 may be formed flat, convex, and/or concave by an appropriate etch. The STI regions 60 may be recessed using an acceptable etching process, such as one that is selective to the material of the insulation material (e.g., selectively etches the insulation material of the STI regions 60 at a faster rate than the materials of the fins 54 and the nanostructures 56). For example, an oxide removal using, for example, dilute hydrofluoric (dHF) acid may be used.

The process described above is just one example of how the fins 54 and the nanostructures 56 may be formed. In some embodiments, the fins 54 and the nanostructures 56 may be formed by an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 54 and the nanostructures 56. The epitaxial structures may include the alternating semiconductor materials discussed above, such as the first semiconductor material and the second semiconductor material. In embodiments where epitaxial structures are epitaxially grown, the epitaxially grown materials may be in situ doped during growth, which may obviate prior and/or subsequent implantations, although in situ and implantation doping may be used together.

Further, appropriate wells may be formed in the substrate 50, the fins 54, and/or the nanostructures 56. In some embodiments, a p-type well may be formed in the n-type region 50N, and a n-type well may be formed in the p-type region 50P. In another embodiment, p-type wells or n-type wells may be formed in both the n-type region 50N and the p-type region 50P.

In embodiments with different well types, different implant steps for the n-type region 50N and the p-type region 50P may be achieved using a photoresist or other masks. For example, a photoresist may be formed over the fins 54, the nanostructures 56, and the STI regions 60 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ $cm^{-3}$ to about $10^{14}$ $cm^{-3}$. After the implant, the photoresist is removed, such as by an acceptable ashing process.

Following the implanting of the p-type region 50P, a photoresist is formed over the fins 54, the nanostructures 56, and the STI regions 60 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of about $10^{13}$ $cm^{-3}$ to about $10^{14}$ $cm^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
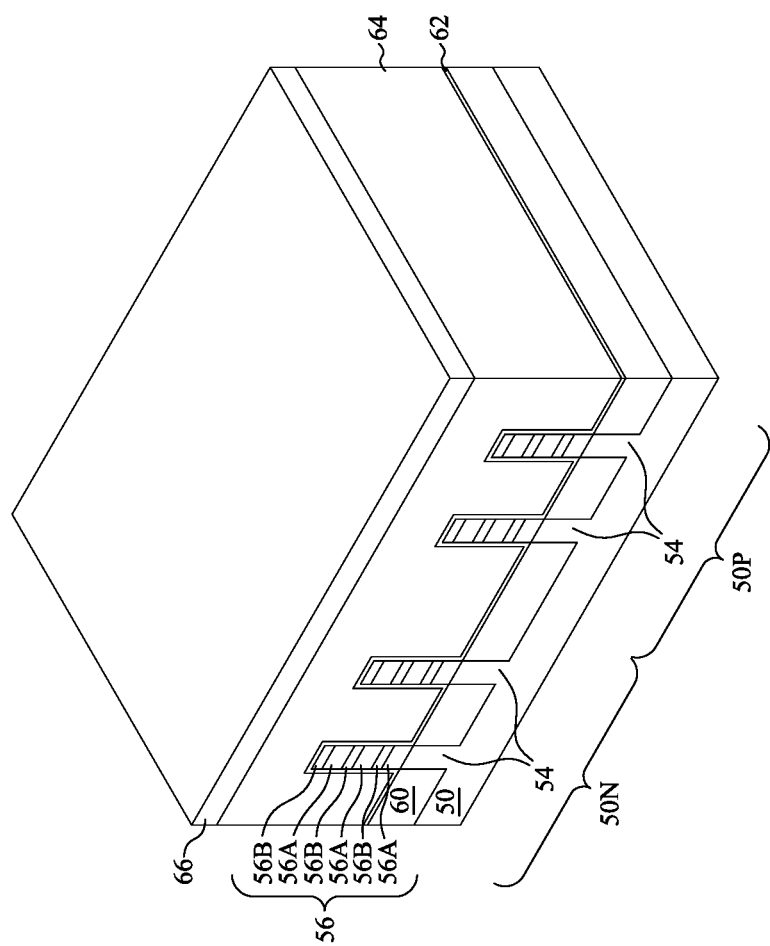

In FIG. 5, a dummy dielectric layer 62 is formed on the fins 54 and the nanostructures 56. The dummy dielectric layer 62 may be, for example, silicon oxide, silicon nitride, a combination thereof, or the like, and may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer 64 may be deposited by physical vapor deposition (PVD), CVD, sputter deposition, or other techniques for depositing the selected material. The dummy gate layer 64 may be made of material(s) that have a high etching selectivity from the etching of insulation materials, e.g., the material(s) of the STI regions 60 and/or the dummy dielectric layer 62. The mask layer 66 may include one or more layers of, for example, silicon nitride, silicon oxynitride, or the like. In this example, a single dummy gate layer 64 and a single mask layer 66 are formed across the n-type region 50N and the p-type region 50P. Although the dummy dielectric layer 62 is shown covering the STI regions 60, it should be appreciate that the dummy dielectric layer 62 can be formed in other manners. In some embodiments, such as when the dummy dielectric layer 62 is thermally grown, the dummy dielectric layer 62 is formed to only cover the fins 54 and the nanostructures 56.

Figure 6:
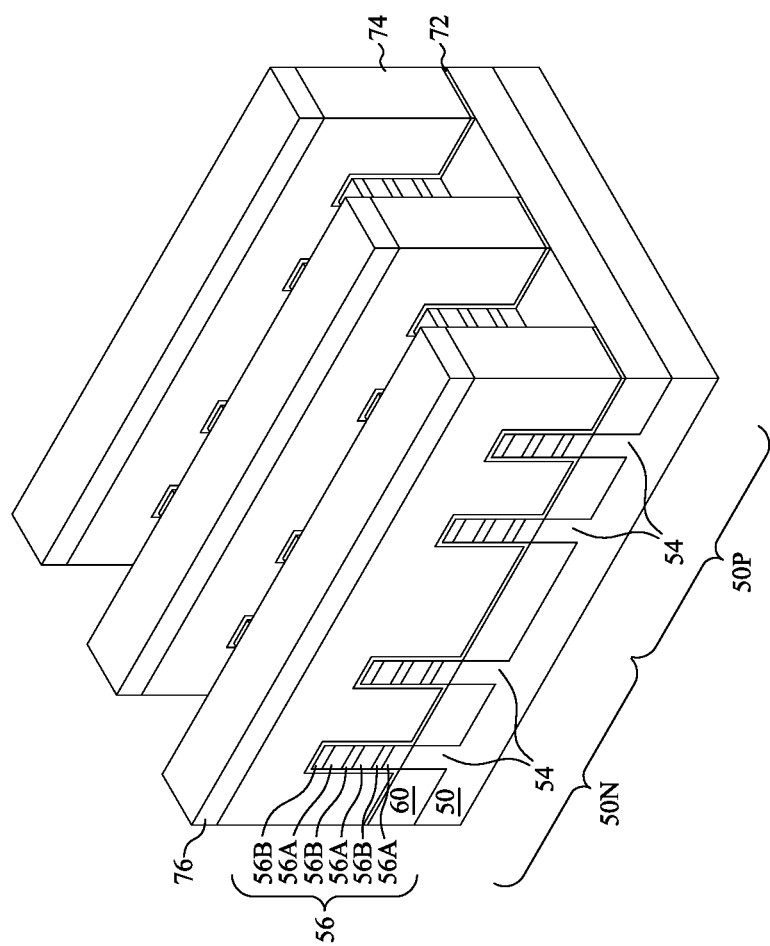

In FIG. 6, the mask layer 66 is patterned using acceptable photolithography and etching techniques to form masks 76. The pattern of the masks 76 is then transferred to the dummy gate layer 64 by an acceptable etching technique to form dummy gates 74. The pattern of the masks 76 may optionally be further transferred to the dummy dielectric layer 62 by an acceptable etching technique to form dummy dielectrics 72. The dummy gates 74 cover portions of the nanostructures 56 that will be exposed in subsequent processing to form channel regions. Specifically, the dummy gates 74 extend along the portions of the nanostructures 56 that will be used to form channel regions 68. The pattern of the masks 76 may be used to physically separate adjacent dummy gates 74. The dummy gates 74 may also have lengthwise directions substantially perpendicular (within process variations) to the lengthwise directions of the fins 54. The masks 76 can optionally be removed after patterning, such as by an acceptable etching technique.

FIGS. 7A through 19D illustrate further intermediate stages in the manufacturing of nano-FETs. FIGS. 7A through 19D may be applicable to both the n-type region 50N and the p-type region 50P. Differences (if any) in the structures of the n-type region 50N and the p-type region 50P are described in the text accompanying each figure.

Figure 7A:
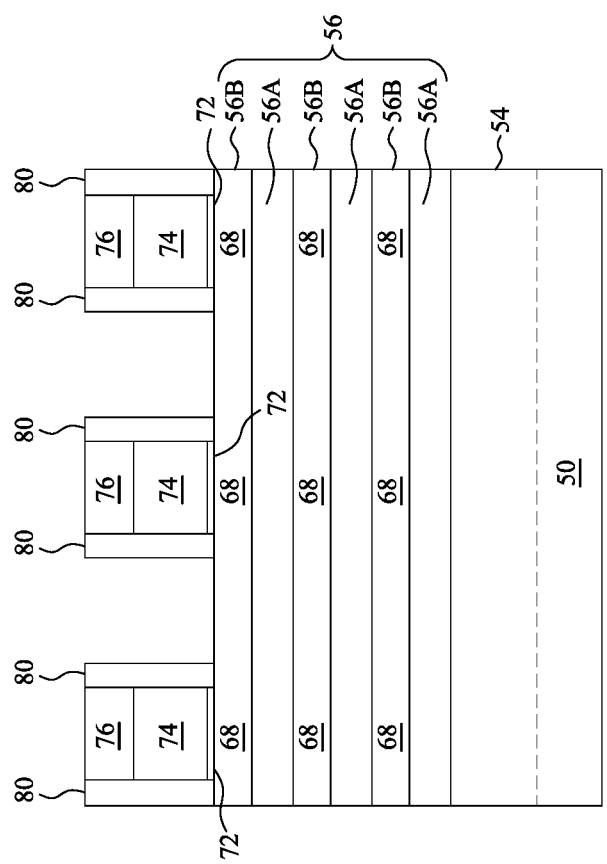
Figure 7B:
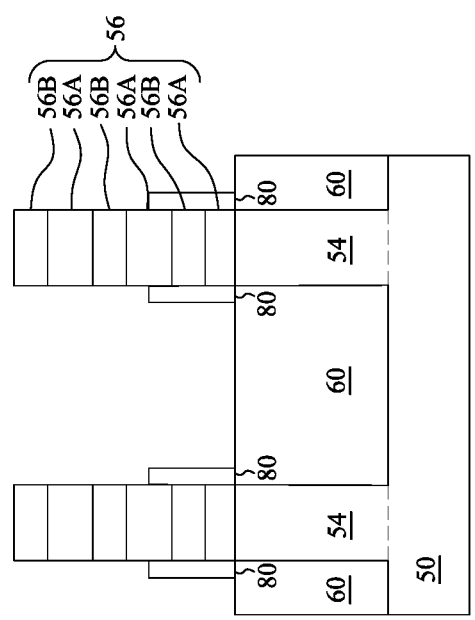

In FIGS. 7A and 7B, gate spacers 80 are formed over the nanostructures 56 and the fins 54, on exposed sidewalls of the masks 76 (if present), the dummy gates 74, and the dummy dielectrics 72. The gate spacers 80 may be formed by conformally forming an insulating material and subsequently etching the insulating material. The insulating material of the gate spacers 80 may be silicon nitride, silicon carbonitride, silicon oxycarbonitride, combinations thereof, or the like, and may be formed by thermal oxidation, deposition, a combination thereof, or the like. The gate spacers 80 can be formed from a single-layered insulating material or multiple layers of insulating materials. In some embodiments, the gate spacers 80 each include multiple layers of silicon oxycarbonitride, where each layer may have a different composition of silicon oxycarbonitride. In some embodiments, the gate spacers 80 each include a layer of silicon oxide disposed between two layers of silicon nitride. Other spacer structures may be formed. The etching of the insulating material may be anisotropic. For example, the etching process may be a dry etch such as RIE, NBE, or the like. After etching, the gate spacers 80 can have straight sidewalls or curved sidewalls. In the illustrated embodiment, the gate spacers 80 are formed on the top surfaces of the STI regions 60, so that subsequent epitaxial growth may be blocked.

Before the formation of the gate spacers 80, implants for lightly doped source/drain (LDD) regions may be performed. In the embodiments with different device types, similar to the implants discussed above, a mask, such as a photoresist, may be formed over the n-type region 50N while exposing the p-type region 50P, and appropriate type (e.g., p-type) impurities may be implanted into the nanostructures 56 and the fins 54 exposed in the p-type region 50P. The mask may then be removed. Subsequently, a mask, such as a photoresist, may be formed over the p-type region 50P while exposing the n-type region 50N, and appropriate type impurities (e.g., n-type) may be implanted into the nanostructures 56 and the fins 54 exposed in the n-type region 50N. The mask may then be removed. The n-type impurities may be any of the n-type impurities previously discussed, and the p-type impurities may be any of the p-type impurities previously discussed. The lightly doped source/drain regions may have a concentration of impurities in the range of about $10^{15}$ cm$^{-3}$ to about $10^{19}$ cm$^{-3}$. An anneal may be used to repair implant damage and to activate the implanted impurities. During the implanting, the channel regions 68 remain covered by the dummy gates 74, so that the channel regions 68 remain substantially free from the impurity implanted in the LDD regions.

It is noted that the above disclosure generally describes a process of forming spacers and LDD regions. Other processes and sequences may be used. For example, fewer or additional spacers may be utilized, different sequence of steps may be utilized (e.g., additional spacers may be formed and removed, etc.), and/or the like. Furthermore, the n-type and p-type devices may be formed using a different structures and steps.

Figure 8A:
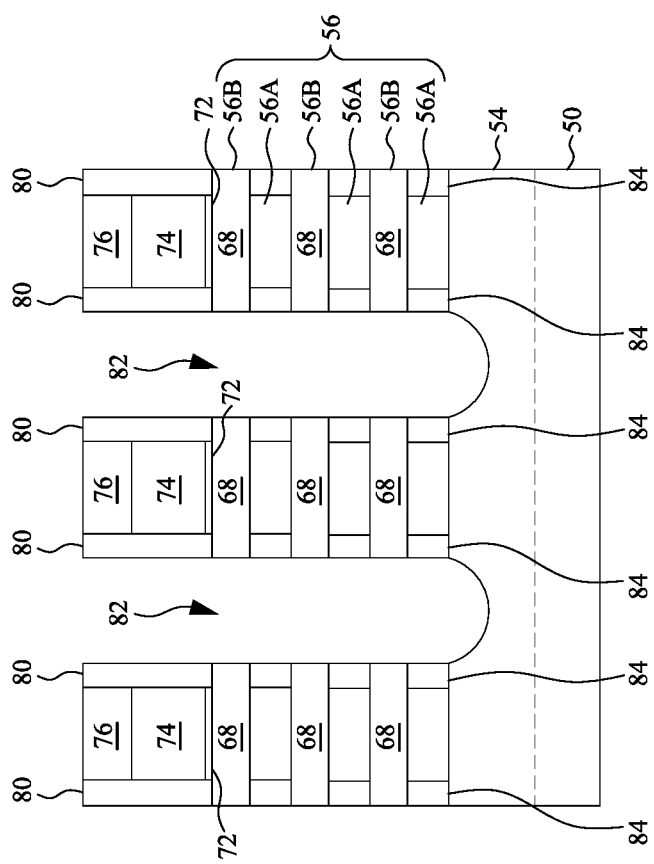
Figure 8B:
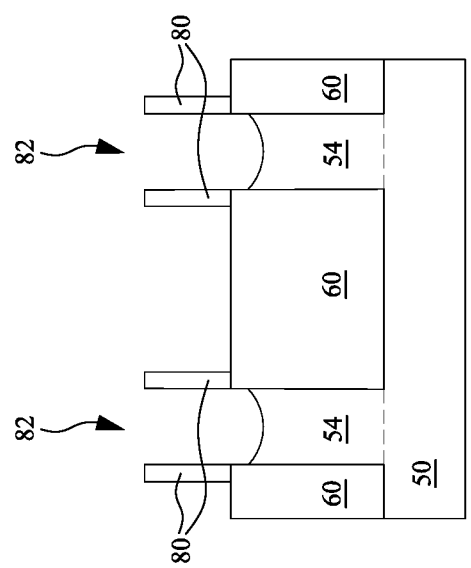

In FIGS. 8A and 8B, source/drain recesses 82 are formed in the nanostructures 56. In the illustrated embodiment, the source/drain recesses 82 extend through the nanostructures 56 to expose the fins 54. The source/drain recesses 82 may also extend into the substrate 50 and/or the fins 54. In various embodiments, the source/drain recesses 82 may extend to a top surface of the substrate 50 without etching the substrate 50; the substrate 50 may be etched such that bottom surfaces of the source/drain recesses 82 are disposed below the top surfaces of the STI regions 60; or the like. The source/drain recesses 82 may be formed by etching the nanostructures 56 using an anisotropic etching processes, such as a RIE, a NBE, or the like. The gate spacers 80 and the dummy gates 74 collectively mask portions of the nanostructures 56, the fins 54, and the substrate 50 during the etching processes used to form the source/drain recesses 82. A single etch process may be used to etch each of the nanostructures 56. In other embodiments, multiple etch processes may be used to etch the nanostructures 56. Timed etch processes may be used to stop the etching of the source/drain recesses 82 after the source/drain recesses 82 reach a desired depth.

Optionally, inner spacers 84 may be formed on the sidewalls of the remaining portions of the first nanostructures 56A, e.g., those sidewalls exposed by the source/drain recesses 82. As will be discussed in greater detail below, source/drain regions will be subsequently formed in the source/drain recesses 82, and the first nanostructures 56A will be subsequently replaced with corresponding gate structures. The inner spacers 84 act as isolation features between the subsequently formed source/drain regions and the subsequently formed gate structures. Further, the inner spacers 84 may be used to prevent damage to the subsequently formed source/drain regions by subsequent etching processes, such as etching processes used to subsequently form the gate structures.

As an example to form the inner spacers 84, the source/drain recesses 82 can be laterally expanded. Specifically, portions of the sidewalls of the first nanostructures 56A exposed by the source/drain recesses 82 may be recessed. Although sidewalls of the first nanostructures 56A are illustrated as being straight, the sidewalls may be concave or convex. The sidewalls may be recessed by an acceptable etching process, such as one that is selective to the material of the first nanostructures 56A (e.g., selectively etches the material of the first nanostructures 56A at a faster rate than the material(s) of the second nanostructures 56B and the fins 54). The etching may be isotropic. For example, when the fins 54 and the second nanostructures 56B are formed of silicon and the first nanostructures 56A are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 82 and recess the sidewalls of the first nanostructures 56A. The inner spacers 84 can then be formed by conformally forming an insulating material and subsequently etching the insulating material. The insulating material may be a material such as silicon nitride or silicon oxynitride, although any suitable material, such as low-dielectric constant (low-k) materials having a k-value less than about 3.5, may be utilized. The insulating material may be deposited by a conformal deposition process, such as ALD, CVD, or the like. The etching of the insulating material may be anisotropic. For example, the etching process may be a dry etch such as RIE, NBE, or the like. Although outer sidewalls of the inner spacers 84 are illustrated as being flush with respect to the sidewalls of the gate spacers 80, the outer sidewalls of the inner spacers 84 may extend beyond or be recessed from the sidewalls of the gate spacers 80. In other words, the inner spacers 84 may partially fill, completely fill, or overfill the sidewall recesses. Moreover, although the sidewalls of the inner spacers 84 are illustrated as being straight, the sidewalls of the inner spacers 84 may be concave or convex.

Figure 9A:
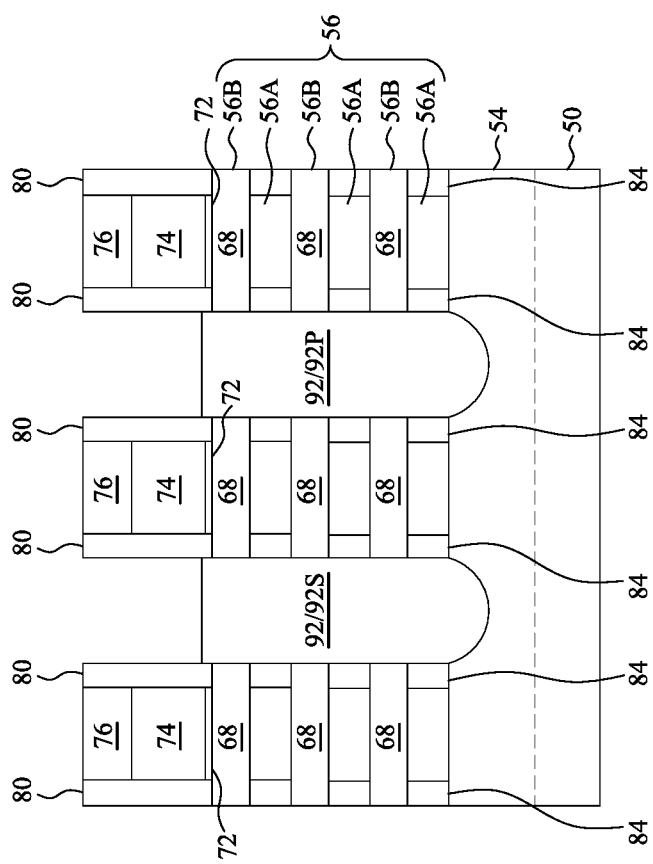
Figure 9C:
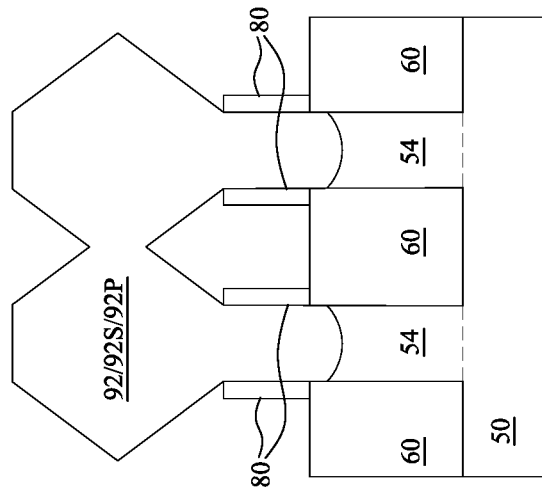
Figure 9B:
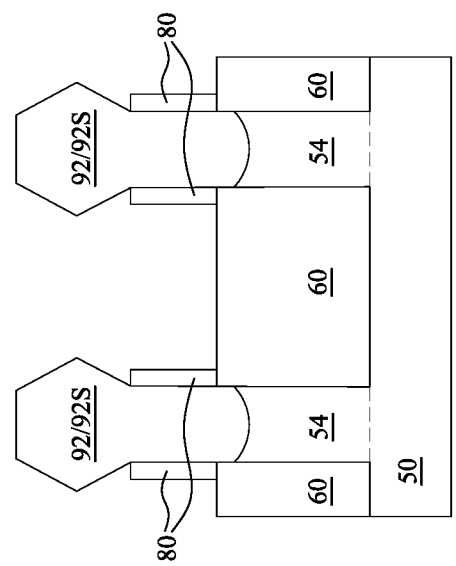

In FIG. 9A through 9C, epitaxial source/drain regions 92 are formed in the source/drain recesses 82. In some embodiments, the epitaxial source/drain regions 92 exert stress on the channel regions 68, thereby improving performance. The epitaxial source/drain regions 92 are formed in the source/drain recesses 82 such that each dummy gate 74 is disposed between respective neighboring pairs of the epitaxial source/drain regions 92. In some embodiments, the gate spacers 80 are used to separate the epitaxial source/drain regions 92 from the dummy gates 74 and the inner spacers 84 are used to separate the epitaxial source/drain regions 92 from the first nanostructures 56A by an appropriate lateral distance so that the epitaxial source/drain regions 92 do not short out with subsequently formed gates of the resulting nano-FETs.

The epitaxial source/drain regions 92 in the n-type region 50N may be formed by masking the p-type region 50P. Then, the epitaxial source/drain regions 92 are epitaxially grown in the source/drain recesses 82 in the n-type region 50N. The epitaxial source/drain regions 92 may include any acceptable material appropriate for n-type nano-FETs. For example, the epitaxial source/drain regions 92 in the n-type region 50N may include materials exerting a tensile strain on the channel regions 68, such as silicon, silicon carbide, phosphorous doped silicon carbide, silicon phosphide, or the like. The epitaxial source/drain regions 92 in the n-type region 50N may have surfaces raised from respective surfaces of the second nanostructures 56B and the fins 54, and may have facets.

The epitaxial source/drain regions 92 in the p-type region 50P may be formed by masking the n-type region 50N. Then, the epitaxial source/drain regions 92 are epitaxially grown in the source/drain recesses 82 in the p-type region 50P. The epitaxial source/drain regions 92 may include any acceptable material appropriate for p-type nano-FETs. For example, the epitaxial source/drain regions 92 in the p-type region 50P may include materials exerting a compressive strain on the channel regions 68, such as silicon germanium, boron doped silicon germanium, germanium, germanium tin, or the like. The epitaxial source/drain regions 92 in the p-type region 50P may have surfaces raised from respective surfaces of the second nanostructures 56B and the fins 54, and may have facets.

The epitaxial source/drain regions 92, the second nanostructures 56B, and/or the fins 54 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the second nanostructures 56B and the fins 54. In some embodiments, adjacent epitaxial source/drain regions 92 remain separated after the epitaxy process is completed as illustrated by FIG. 9B. In some embodiments, these facets cause adjacent epitaxial source/drain regions 92 of a same nano-FET to merge as illustrated by FIG. 9C. In the illustrated embodiments, the gate spacers 80 are formed on the top surfaces of the STI regions 60, thereby blocking the epitaxial growth. In some other embodiments, the spacer etch used to form the gate spacers 80 may be adjusted to remove the spacer material to allow the epitaxially grown regions to extend to the top surfaces of the STI regions 60.

The epitaxial source/drain regions 92 may include one or more semiconductor material layers. For example, the epitaxial source/drain regions 92 may comprise a first semiconductor material layer, a second semiconductor material layer, and a third semiconductor material layer. Any number of semiconductor material layers may be used for the epitaxial source/drain regions 92. Each of the first semiconductor material layer, the second semiconductor material layer, and the third semiconductor material layer may be formed of different semiconductor materials and may be doped to different dopant concentrations. In some embodiments, the first semiconductor material layer may have a dopant concentration less than the second semiconductor material layer and greater than the third semiconductor material layer. In embodiments in which the epitaxial source/drain regions 92 comprise three semiconductor material layers, the first semiconductor material layer may be deposited, the second semiconductor material layer may be deposited over the first semiconductor material layer, and the third semiconductor material layer may be deposited over the second semiconductor material layer.

Figure 10A:
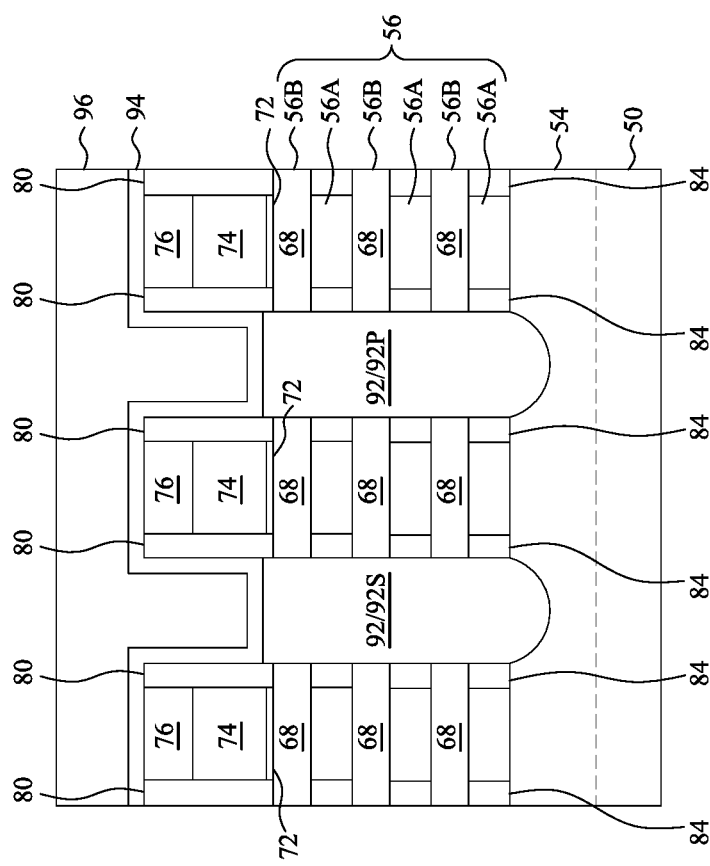
Figure 10B:
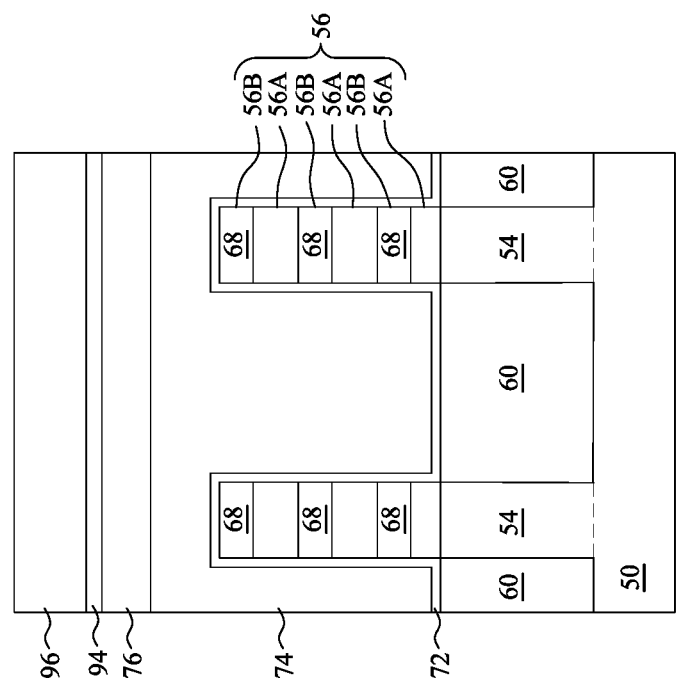

In FIGS. 10A and 10B, a first ILD 96 is deposited over the epitaxial source/drain regions 92, the gate spacers 80, the masks 76 (if present) or the dummy gates 74, and the STI regions 60. The first ILD 96 may be formed of a dielectric material, and may be deposited by any suitable method, such as CVD, plasma-enhanced CVD (PECVD), FCVD, or the like. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 94 is formed between the first ILD 96 and the epitaxial source/drain regions 92, the gate spacers 80, and the STI regions 60. The CESL 94 may be formed of a dielectric material, such as silicon nitride, silicon oxide, silicon oxynitride, or the like, having a high etching selectivity from the etching of the first ILD 96. The CESL 94 may be formed by an any suitable method, such as CVD, ALD, or the like.

Figure 11A:
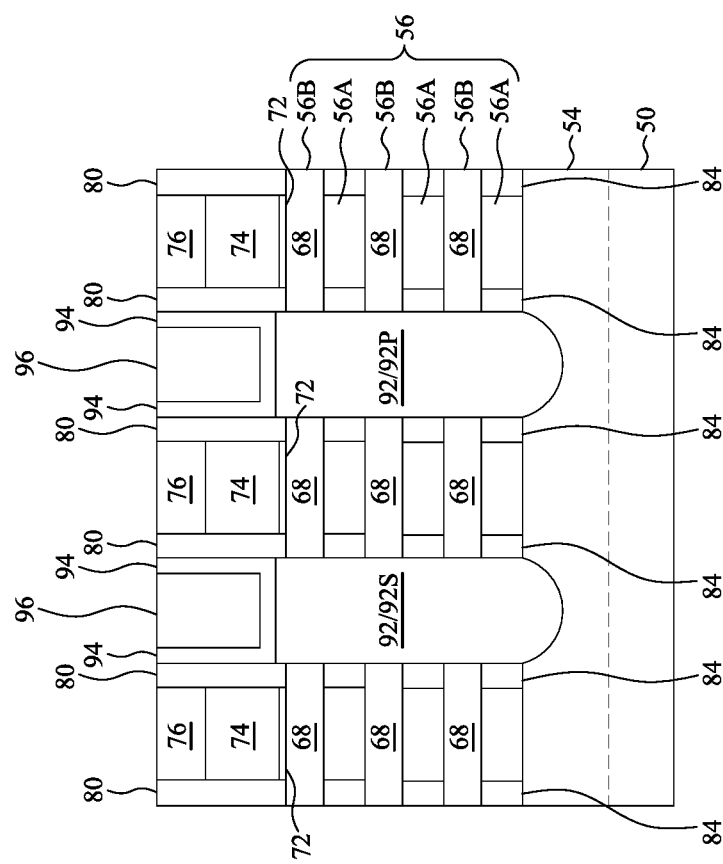
Figure 11B:
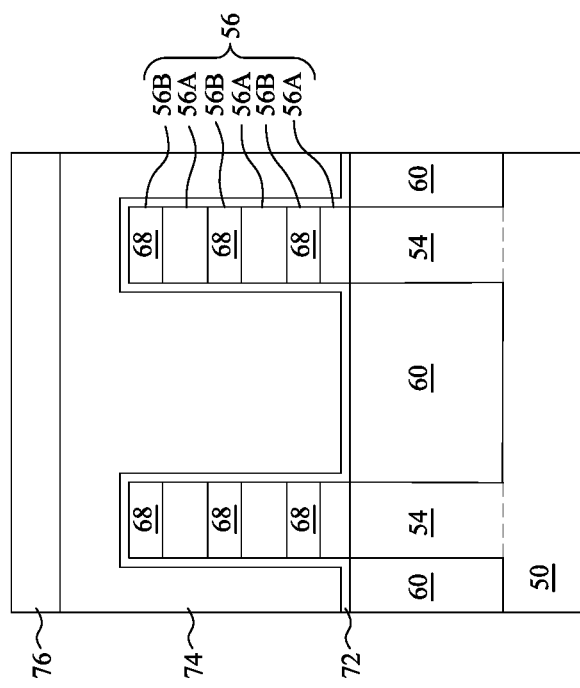

In FIGS. 11A and 11B, a removal process is performed to level the top surfaces of the first ILD 96 with the top surfaces of the masks 76 (if present) or the dummy gates 74. In some embodiments, a planarization process such as a chemical mechanical polish (CMP), an etch-back process, combinations thereof, or the like may be utilized. The planarization process may also remove the masks 76 on the dummy gates 74, and portions of the gate spacers 80 along sidewalls of the masks 76. After the planarization process, the top surfaces of the gate spacers 80, the first ILD 96, the CESL 94, and the masks 76 (if present) or the dummy gates 74 are coplanar (within process variations). Accordingly, the top surfaces of the masks 76 (if present) or the dummy gates 74 are exposed through the first ILD 96. In the illustrated embodiment, the masks 76 remain, and the planarization process levels the top surfaces of the first ILD 96 with the top surfaces of the masks 76.

Figure 12A:
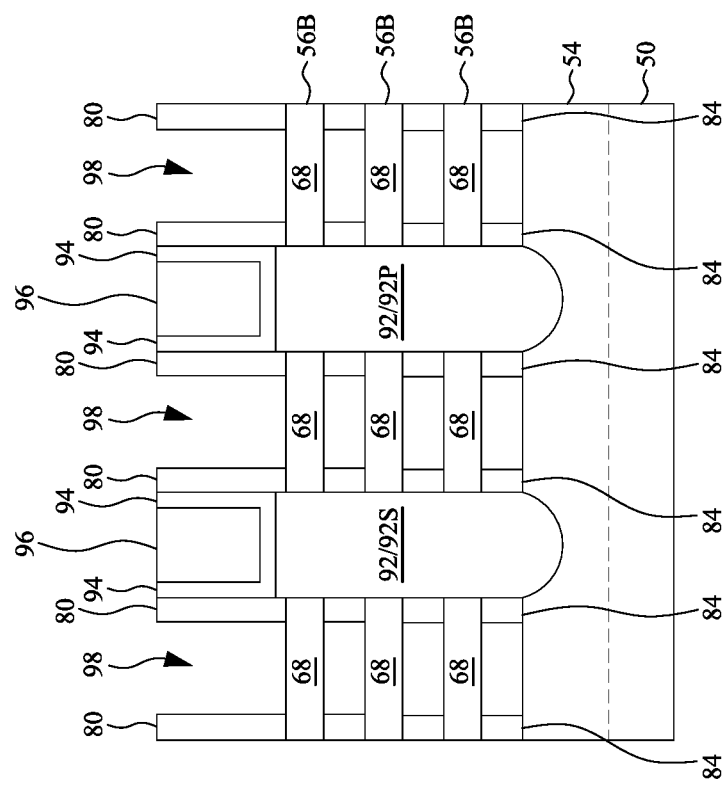

In FIGS. 12A and 12B, the masks 76 (if present) and the dummy gates 74 are removed in an etching process, so that recesses 98 are formed. Portions of the dummy dielectrics 72 in the recesses 98 may also be removed. In some embodiments, the dummy gates 74 are removed by an anisotropic dry etch process. For example, the etching process may include a dry etch process using reaction gas(es) that selectively etch the dummy gates 74 at a faster rate than the first ILD 96 or the gate spacers 80. During the removal, the dummy dielectrics 72 may be used as etch stop layers when the dummy gates 74 are etched. The dummy dielectrics 72 may then be removed after the removal of the dummy gates 74. Each recess 98 exposes and/or overlies portions of the channel regions 68. Portions of the second nanostructures 56B which act as the channel regions 68 are disposed between neighboring pairs of the epitaxial source/drain regions 92.

The remaining portions of the first nanostructures 56A are then removed to expand the recesses 98. The remaining portions of the first nanostructures 56A can be removed by an acceptable etching process that selectively etches the material of the first nanostructures 56A at a faster rate than the materials of the second nanostructures 56B, the fins 54, and the STI regions 60. The etching may be isotropic. For example, when the fins 54 and the second nanostructures 56B are formed of silicon and the first nanostructures 56A are formed of silicon germanium, the etching process may be a wet etch using tetramethylammonium hydroxide (TMAH), ammonium hydroxide ($NH_4OH$), or the like. In some embodiments (discussed in greater detail below), a trim process is performed to reduce the thicknesses of the exposed portions of the second nanostructures 56B.

Figure 13A:
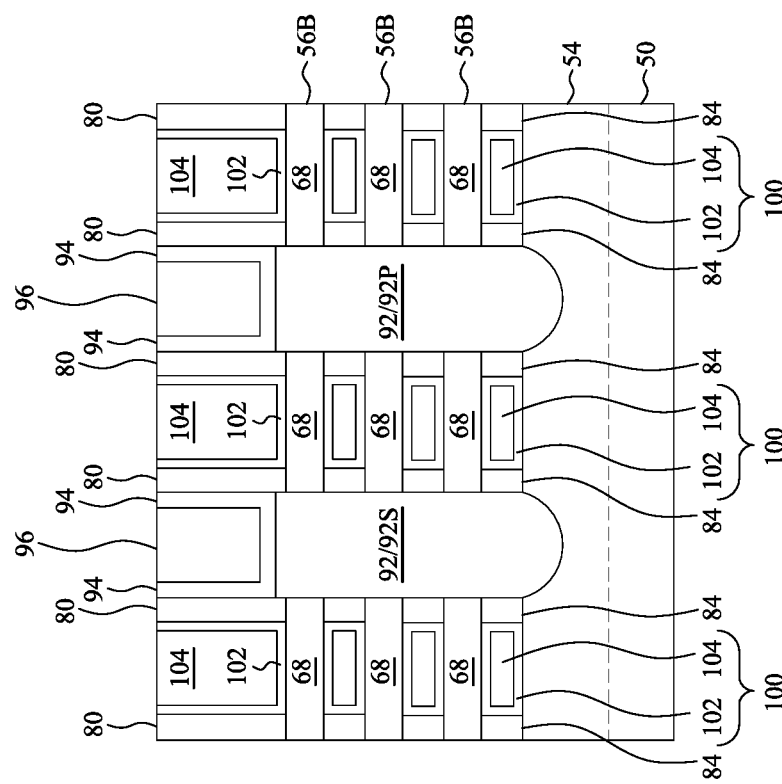
Figure 13B:
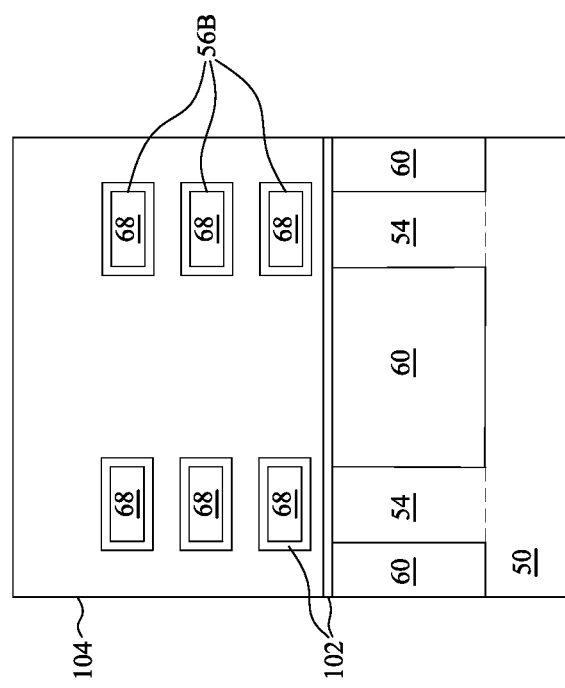

In FIGS. 13A and 13B, gate dielectrics 102 and gate electrodes 104 are formed for replacement gates. The gate dielectrics 102 are deposited conformally in the recesses 98, such as on top surfaces and sidewalls of the fins 54 and on top surfaces, sidewalls, and bottom surfaces of the nanostructures 56B. The gate dielectrics 102 may also be deposited on top surfaces of the first ILD 96, the gate spacers 80, and the STI regions 60. The gate dielectrics 102 include one or more dielectric layers, such as an oxide, a metal oxide, a metal silicate, the like, or combinations thereof. In some embodiments, the gate dielectrics 102 include silicon oxide, silicon nitride, or multilayers thereof. In some embodiments, the gate dielectrics 102 include a high-k dielectric material, and in these embodiments, the gate dielectrics 102 may have a k value greater than about 7.0, and may include a metal oxide or a silicate of hafnium, aluminum, zirconium, lanthanum, manganese, barium, titanium, lead, and combinations thereof. The gate dielectrics 102 can be multilayered. For example, in some embodiments, the gate dielectrics 102 may each include an interfacial layer of silicon oxide formed by thermal or chemical oxidation and a metal oxide layer over the interfacial layer. The material(s) of the gate dielectrics 102 may be formed by molecular-beam deposition (MBD), ALD, PECVD, or the like.

The gate electrodes 104 are deposited over the gate dielectrics 102, respectively, and fill the remaining portions of the recesses 98. The gate electrodes 104 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 104 are illustrated, the gate electrodes 104 may comprise any number of liner layers, any number of work function tuning layers, and a fill material. Any combination of the layers which make up the gate electrodes 104 may be deposited in the areas between each of the second nanostructures 56B and between the fins 54 and the second nanostructures 56B. The material(s) of the gate electrodes 104 may be formed by ALD, PECVD, or the like.

After the filling of the recesses 98, a planarization process, such as a CMP, may be performed to remove the excess portions of the materials of the gate dielectrics 102 and the gate electrodes 104, which excess portions are over the top surfaces of the first ILD 96 and the gate spacers 80. The remaining portions of the materials of the gate dielectrics 102 and the gate electrodes 104 thus form replacement gates of the resulting nano-FETs. The gate dielectrics 102 and the gate electrodes 104 may be collectively referred to as gate structures 100 or "gate stacks."

The formation of the gate dielectrics 102 in the n-type region 50N and the p-type region 50P may occur simultaneously such that the gate dielectrics 102 in each region are formed from the same materials, and the formation of the gate electrodes 104 may occur simultaneously such that the gate electrodes 104 in each region are formed from the same materials. In some embodiments, the gate dielectrics 102 in each region may be formed by distinct processes, such that the gate dielectrics 102 may be different materials, and/or the gate electrodes 104 in each region may be formed by distinct processes, such that the gate electrodes 104 may be different materials. Various masking steps may be used to mask and expose appropriate regions when using distinct processes.

Figure 14A:
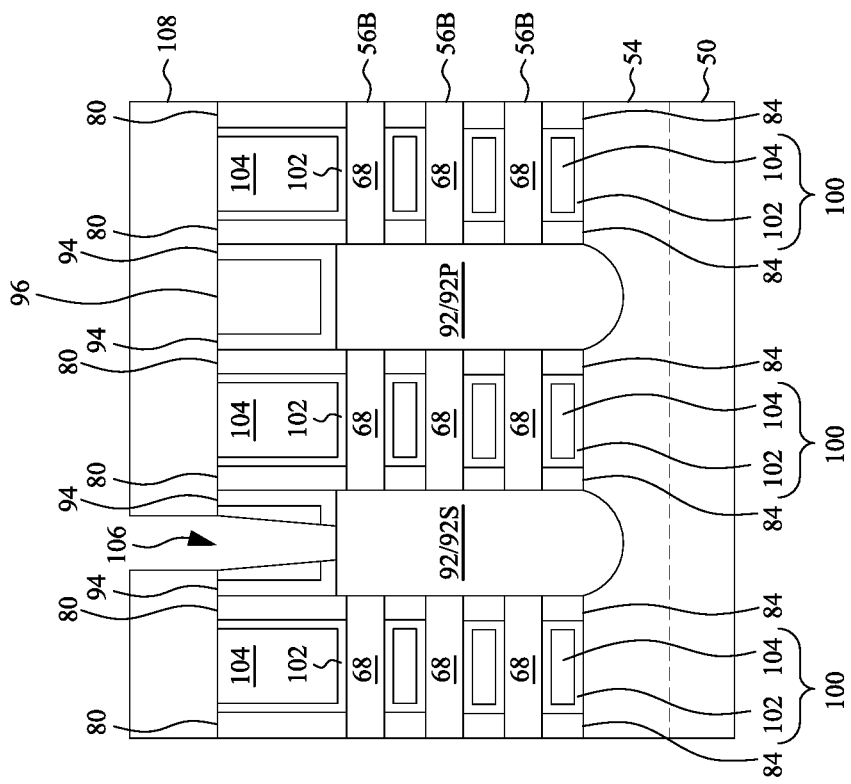
Figure 14C:
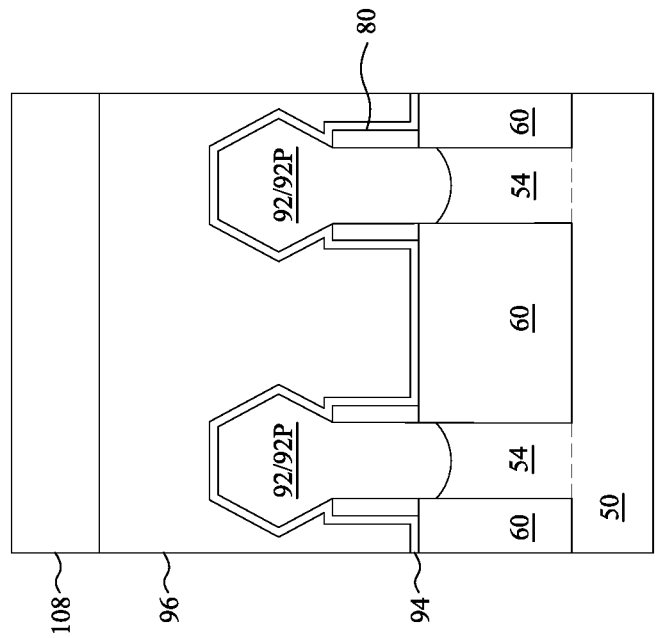
Figure 14B:
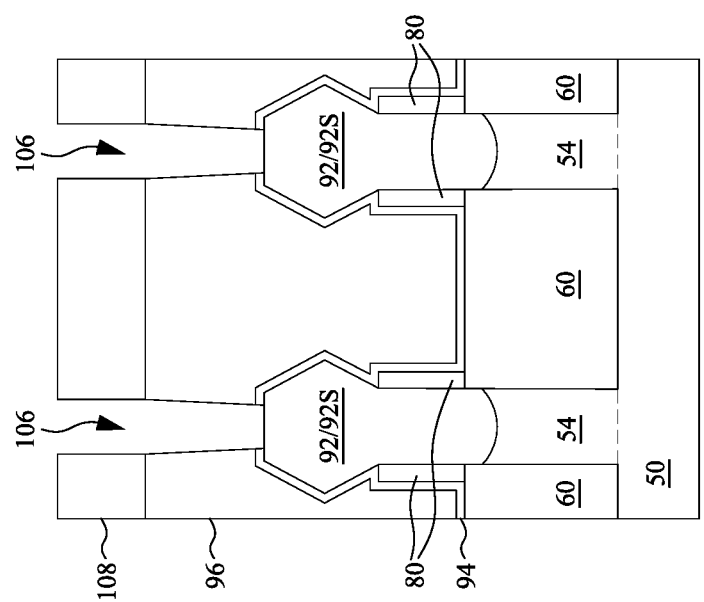

In FIGS. 14A through 14C, source/drain contact openings 106 are formed through the first ILD 96 and the CESL 94, thus exposing a subset of the epitaxial source/drain regions 92S. The source/drain contact openings 106 may be initially formed in the first ILD 96 using acceptable photolithography and etching techniques, such as with an etching process that is selective to the first ILD 96 (e.g., etches the material of the first ILD 96 at a faster rate than the material of the CESL 94). For example, the source/drain contact openings 106 may be initially formed through the first ILD 96 by a dry etch using ammonia ($NH_3$) and hydrogen fluoride (HF) gas. The source/drain contact openings 106 are then extended through the CESL 94 using acceptable etching techniques, such as with an etching process that is selective to the CESL 94 (e.g., etches the material of the CESL 94 at a faster rate than the material of the epitaxial source/drain regions 92S). For example, the source/drain contact openings 106 may be extended through the CESL 94 by a dry etch using a fluorine-based gas (e.g., $C_4F_6$) and hydrogen ($H_2$) or oxygen ($O_2$) gas. In some embodiments, the etching process parameters (e.g., etchants, duration, environment, etc.) used to etch the source/drain contact openings 106 through the first ILD 96 are different from the etching process parameters used to etch the source/drain contact openings 106 through the CESL 94.

During the process for forming the source/drain contact openings 106, a mask 108 having a pattern of the source/drain contact openings 106 is formed over the first ILD 96. The mask 108 is used as an etching mask during the etching processes used to etch the source/drain contact openings 106 through the first ILD 96 and the CESL 94.

In some embodiments, the mask 108 is formed of a photoresist, such as a single layer photoresist, a bi-layer photoresist, a tri-layer photoresist, or the like. For example, the mask 108 may be a tri-layer photoresist including a bottom layer (e.g., a bottom anti-reflective coating (BARC) layer), a middle layer (e.g., a hardmask), and a top layer (e.g., a photoresist). The type of photoresist used (e.g., single layer photoresist, bilayer photoresist, tri-layer photoresist, etc.) may depend on the photolithography process used to subsequently pattern the photoresist. For example, in extreme ultraviolet (EUV) lithography processes, the mask 108 may be a single layer photoresist or a bilayer photoresist. The photoresist may be formed by spin coating, a deposition process such as CVD, combinations thereof, or the like, and can be patterned using acceptable photolithography techniques to have a pattern of the source/drain contact openings 106.

In some embodiments, the mask 108 is formed of spacers. For example, a sacrificial layer can be formed over the first ILD 96 and patterned using a photolithography process.

Spacers are formed alongside the patterned sacrificial layer using a self-aligned process. The sacrificial layer is then removed, and the remaining spacers may then be used as the mask 108. Other types of masks may also be used to etch the source/drain contact openings 106.

Source/drain contacts will subsequently be formed in the source/drain contact openings 106 and attached to the front-sides of the epitaxial source/drain regions 92S. As noted above, a first subset of the epitaxial source/drain regions 92P will be connected to dedicated power rails, and a second subset of the epitaxial source/drain regions 92S will not be connected to the dedicated power rails. As will be discussed in greater detail below, the power rails will be subsequently attached through the back-sides of the epitaxial source/drain regions 92P. Thus, contacts to the front-sides of the epitaxial source/drain regions 92P are undesired. According to various embodiments, the source/drain contact openings 106 are formed over and expose the front-sides of the epitaxial source/drain regions 92S, while the front-sides of the epitaxial source/drain regions 92P remain completely covered by dielectric material (e.g., the CESL 94). In other words, the entirety of the front-side of each of the epitaxial source/drain regions 92P is covered by dielectric material (e.g., the CESL 94). Formation of the source/drain contact openings 106 over the epitaxial source/drain regions 92P may be avoided in several manners.

In some embodiments, a single-patterning process is used to pattern the mask 108. Single-patterning may be used when the mask 108 is formed of a photoresist. In such embodiments, the photoresist can be formed to have a pattern of openings over the epitaxial source/drain regions 92S but not the epitaxial source/drain regions 92P. The photoresist can be patterned by exposing the photoresist to a patterned energy source (e.g., a patterned light source) so as to induce a chemical reaction, thus inducing a physical change in those portions of the photoresist exposed to the patterned light source. The patterned energy source only has a pattern of the epitaxial source/drain regions 92S, and does not have a pattern of the epitaxial source/drain regions 92P. The photoresist can then be developed by applying a developer to the exposed photoresist to take advantage of the physical changes and selectively remove either the exposed portion of the photoresist or the unexposed portion of the photoresist, depending upon the desired pattern.

In some embodiments, a multiple-patterning process is used to pattern the mask 108. Multiple-patterning may be used when the mask 108 is formed of spacers. In such embodiments, the mask 108 may be initially formed with a pattern of openings over all of the epitaxial source/drain regions 92P, 92S. The portions of the pattern of openings over the epitaxial source/drain regions 92P are then covered or filled so that only the portions of the pattern of openings over the epitaxial source/drain regions 92S remain in the mask 108. The openings over the epitaxial source/drain regions 92P may be covered or filled by forming an additional mask, such as a patterned photoresist, a patterned hardmask, or the like.

Selectively forming the source/drain contact openings 106 over the epitaxial source/drain regions 92S can include additional processing steps, particularly when a multiple-patterning process is used to pattern the mask 108. However, as noted above, contacts to the front-sides of the epitaxial source/drain regions 92P are undesired. If undesired contacts were formed to the front-sides of the epitaxial source/drain regions 92P, such contacts would remain isolated and unused, increasing the parasitic capacitance of the nano-FETs. Thus, although avoiding the formation of contacts to the front-sides of the epitaxial source/drain regions 92P includes additional processing steps, the performance of the nano-FETs may be improved by avoiding the formation of such contacts.

Figure 15A:
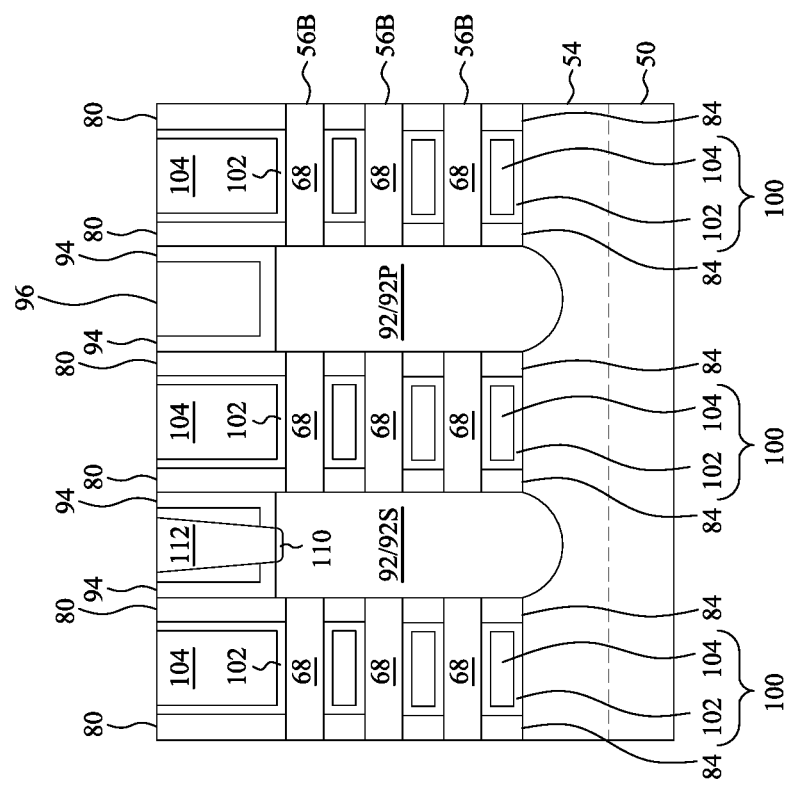
Figure 15C:
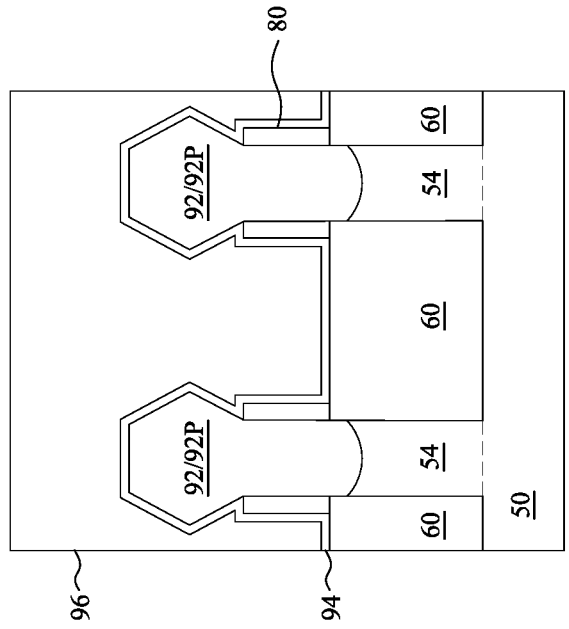
Figure 15B:
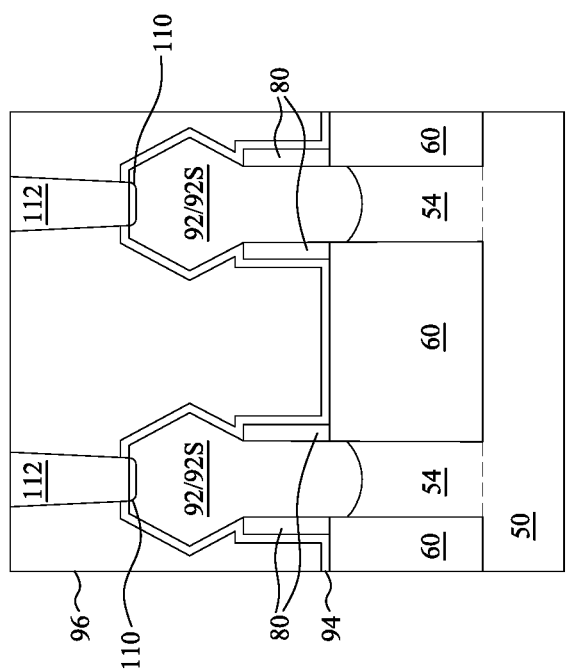

In FIGS. 15A through 15C, the mask 108 is removed. When the mask 108 includes a photoresist, the photoresist can be removed by, e.g., an acceptable ashing process. When the mask 108 includes other layers (e.g., a BARC layer, a hardmask, spacers, etc.), acceptable etching processes can be used to remove the layers.

Metal-semiconductor alloy regions 110 can optionally be formed in the source/drain contact openings 106, such as on portions of the epitaxial source/drain regions 92S exposed by the source/drain contact openings 106. The metal-semiconductor alloy regions 110 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 110 can be formed by depositing a metal in the source/drain contact openings 106 and then performing a thermal anneal process. The metal can be any metal capable of reacting with the semiconductor materials (e.g., silicon, silicon germanium, germanium, etc.) of the epitaxial source/drain regions 92S to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. In an embodiment, the metal-semiconductor alloy regions 110 are silicide regions formed of titanium-silicon. After the thermal anneal process, a cleaning process, such as a wet clean, may be performed to remove any residual metal from the source/drain contact openings 106, such as from the top surfaces of the first ILD 96.

Lower source/drain contacts 112 are then formed in the source/drain contact openings 106. A liner, such as a diffusion barrier layer, an adhesion layer, or the like, and a conductive material are formed in the source/drain contact openings 106. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by ALD, CVD, PVD, or the like. A planarization process, such as a CMP, may be performed to remove excess material from the top surfaces of the first ILD 96. The remaining liner and conductive material in the source/drain contact openings 106 forms the lower source/drain contacts 112. The lower source/drain contacts 112 are physically and electrically coupled to the metal-semiconductor alloy regions 110 (if present) or the front-sides of the epitaxial source/drain regions 92S. The top surfaces of the lower source/drain contacts 112, the gate electrodes 104, the first ILD 96, and the gate spacers 80 are coplanar (within process variations).

Figure 16A:
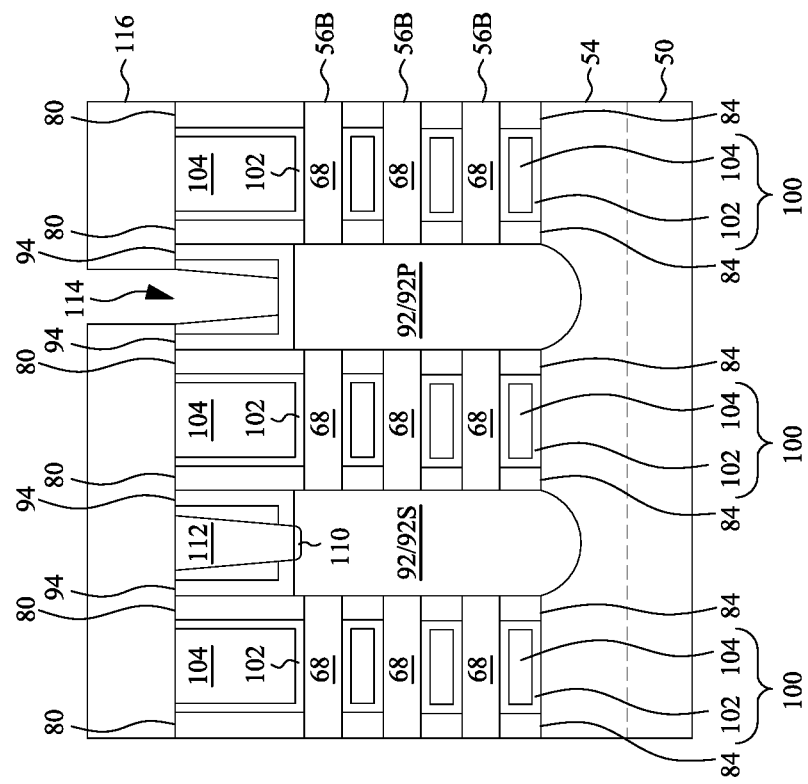
Figure 16C:
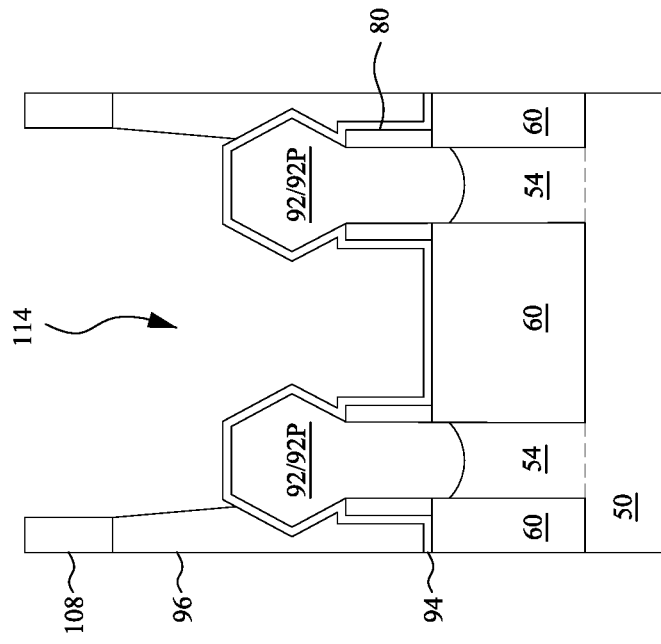
Figure 16B:
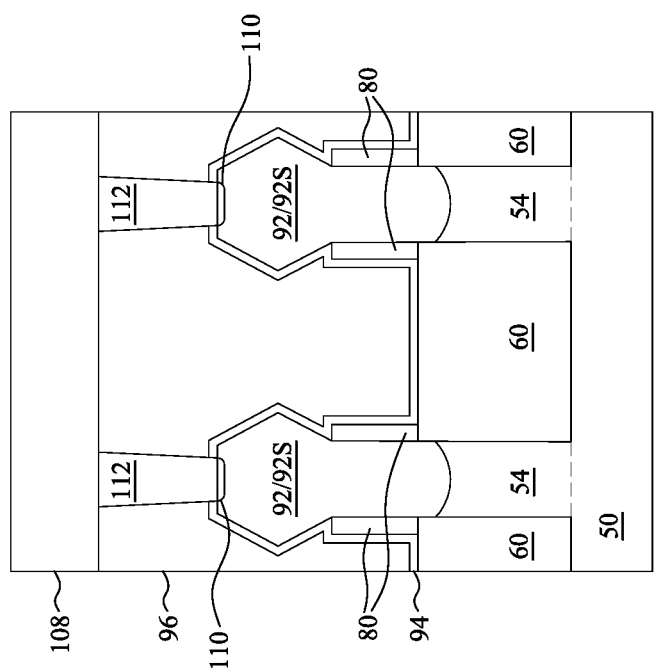

In FIGS. 16A through 16C, trenches 114 are formed through the first ILD 96, thus exposing portions of the CESL 94 over the epitaxial source/drain regions 92P. The trenches 114 may be formed in the first ILD 96 using acceptable photolithography and etching techniques, such as with an etching process that is selective to the first ILD 96 (e.g., etches the material of the first ILD 96 at a faster rate than the material of the CESL 94). For example, the trenches 114 may be formed through the first ILD 96 by a dry etch using ammonia (NH$_3$) and hydrogen fluoride (HF) gas. In some embodiments, the trenches 114 may be formed in the first ILD 96 using similar etching process parameters as those used to initially form the source/drain contact openings 106 through the first ILD 96.

During the process for forming the trenches 114, a mask 116 having a pattern of the trenches 114 is formed over the first ILD 96. The mask 116 is used as an etching mask during the etching processes used to etch the trenches 114 through the first ILD 96. The mask 116 may be formed in a similar manner and using similar materials as the mask 108 discussed with respect to FIGS. 14A through 14C. As shown by FIG. 16C, the trenches 114 extend across multiple adjacent epitaxial source/drain regions 92P. In other words, the trenches 114 extend across multiple fins 54 (or across multiple groups of fins 54, when the adjacent epitaxial source/drain regions 92 of a same nano-FET have merged, as illustrated by FIG. 9C).

Figure 17A:
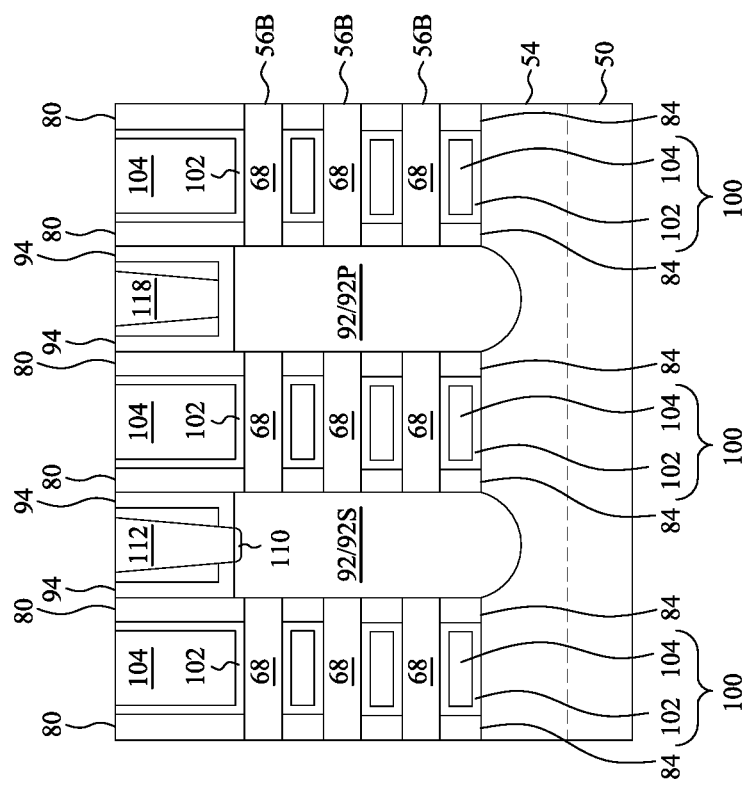
Figure 17C:
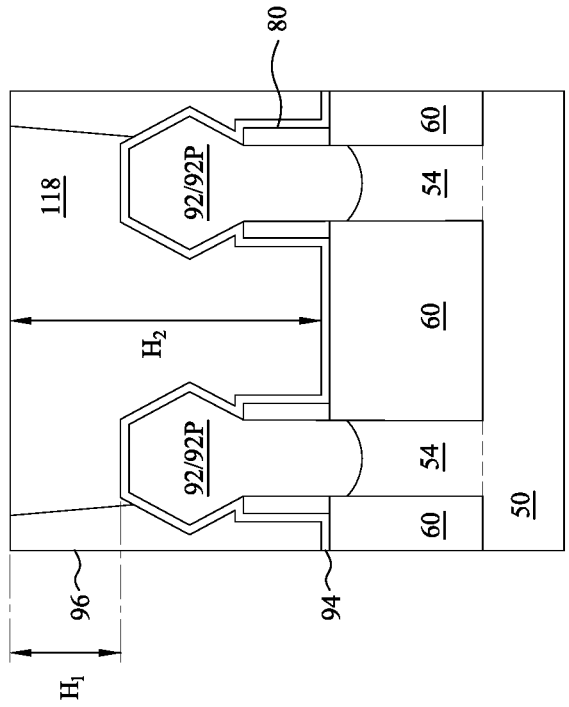
Figure 17B:
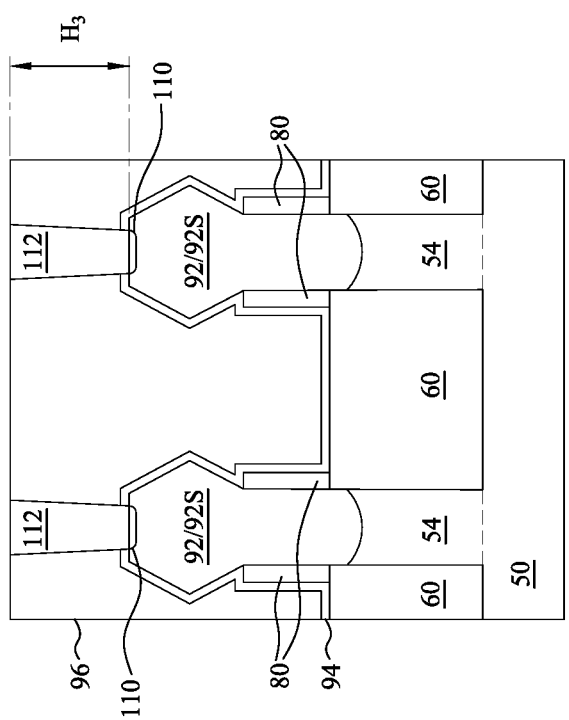
Figure 18:
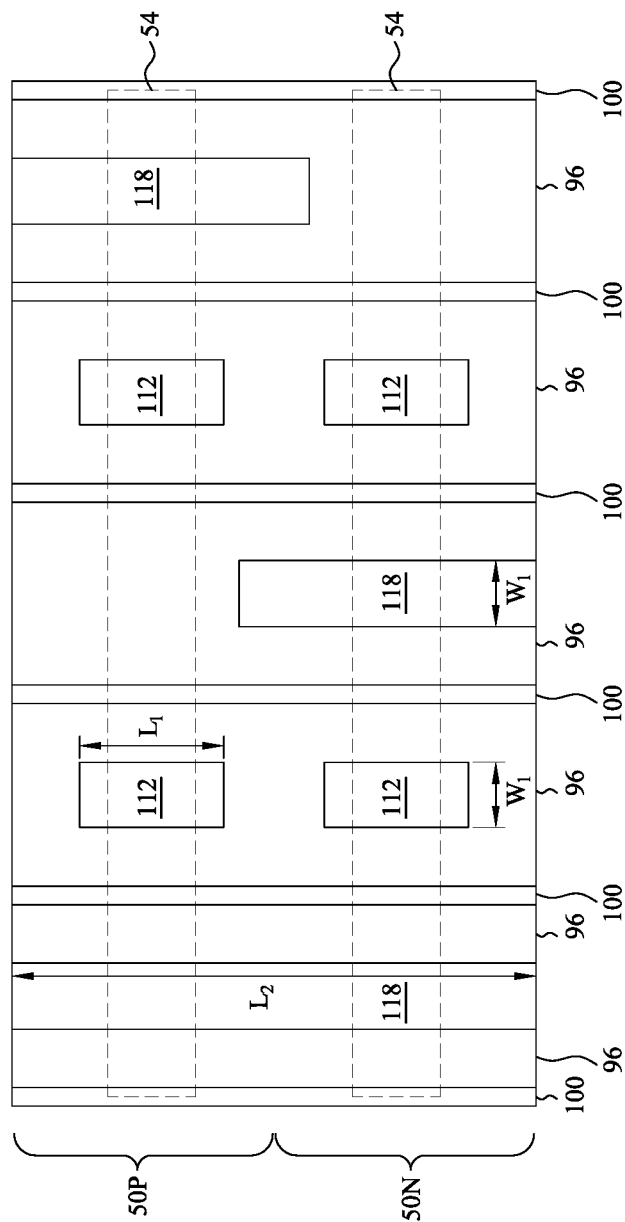
Figure 19A:
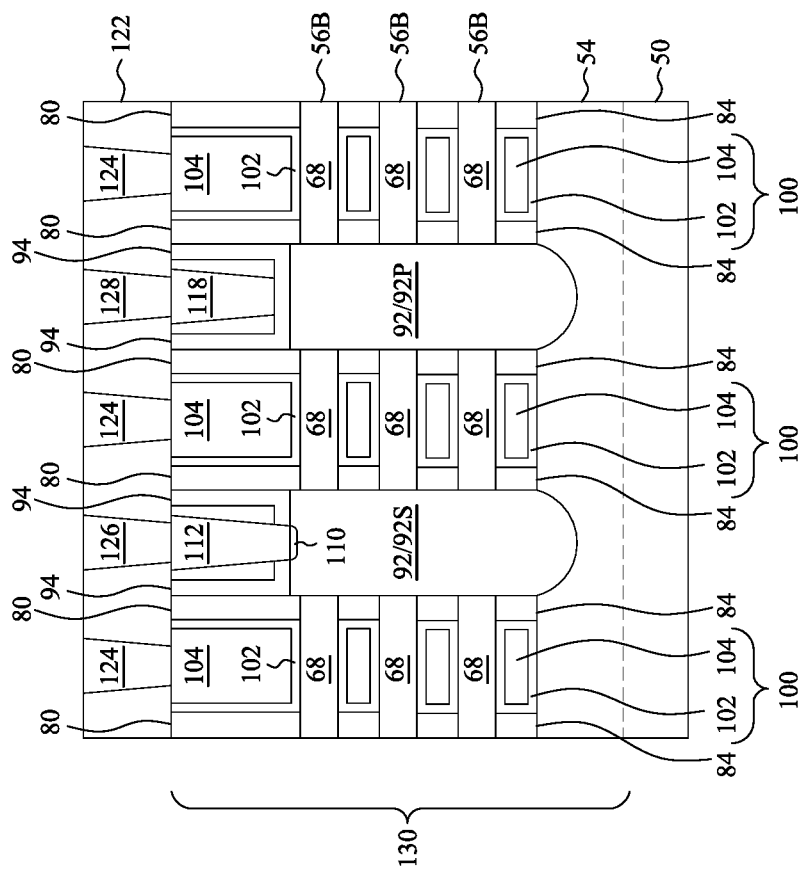
Figure 19B:
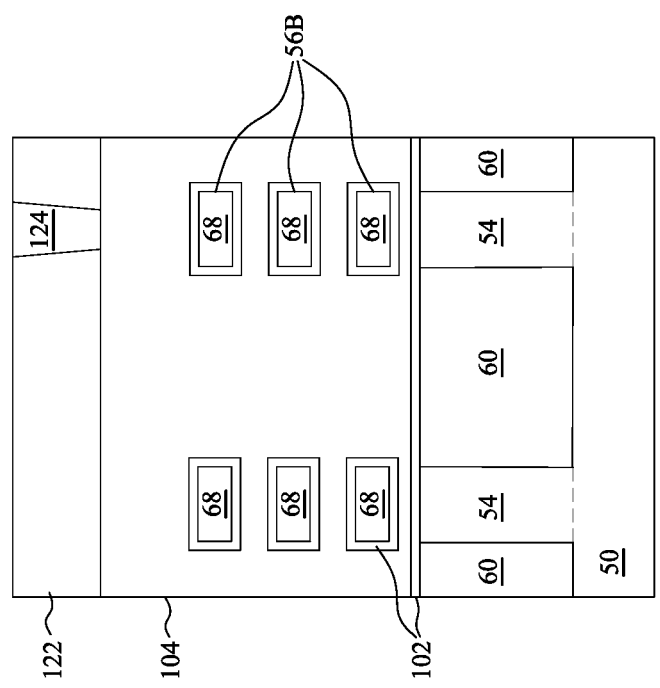
Figure 19D:
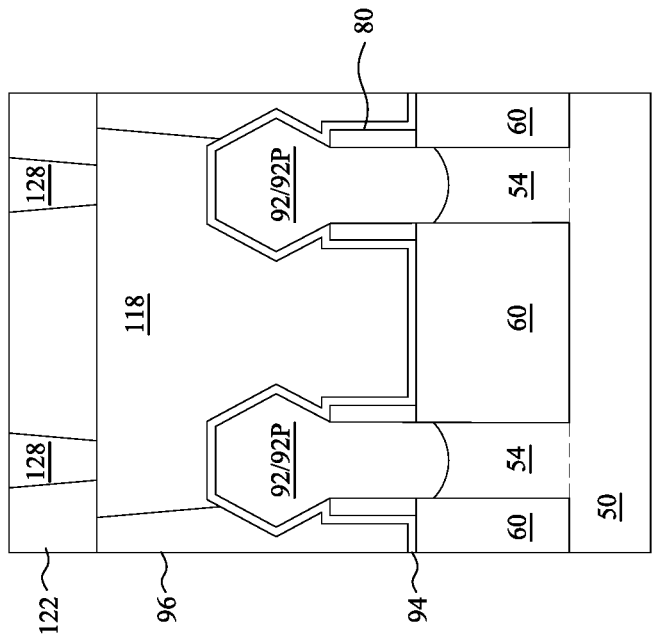
Figure 19C:
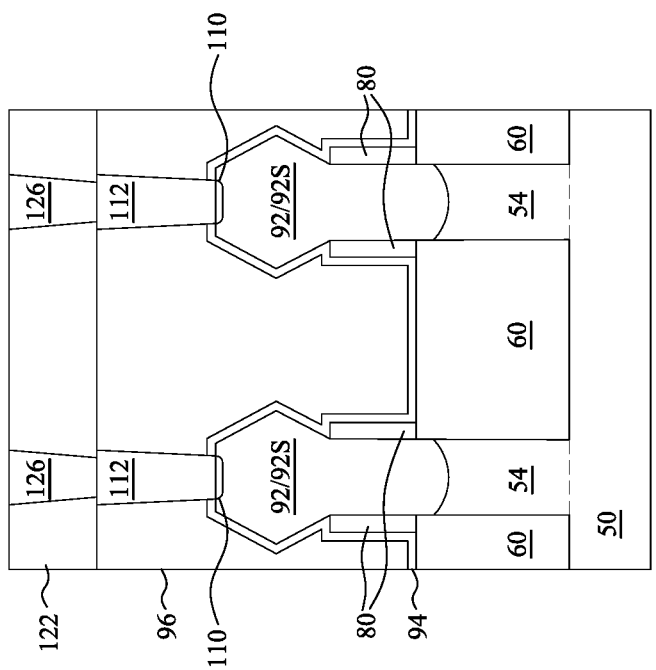

In FIGS. 17A through 17C, the mask 116 is removed. When the mask 116 includes a photoresist, the photoresist can be removed by, e.g., an acceptable ashing process. When the mask 116 includes other layers (e.g., a BARC layer, a hardmask, spacers, etc.), acceptable etching processes can be used to remove the layers.

Conductive lines 118 are then formed in the trenches 114. A liner, such as a diffusion barrier layer, an adhesion layer, or the like, and a conductive material are formed in the trenches 114. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by ALD, CVD, PVD, or the like. A planarization process, such as a CMP, may be performed to remove excess material from the top surfaces of the first ILD 96. The remaining liner and conductive material in the trenches 114 forms the conductive lines 118. The top surfaces of the conductive lines 118, the lower source/drain contacts 112, the gate electrodes 104, the first ILD 96, and the gate spacers 80 are coplanar (within process variations).

No metal-semiconductor alloy regions are formed in the trenches 114, and the conductive lines 118 are physically and electrically isolated from the epitaxial source/drain regions 92P by the CESL 94. As noted above, contacts to the front-sides of the epitaxial source/drain regions 92P are undesired. The portions of the first ILD 96 over the epitaxial source/drain regions 92P can thus be used for other purposes. Specifically, the conductive lines 118 are formed in the portions of the first ILD 96 over the epitaxial source/drain regions 92P, while the front-sides of the epitaxial source/drain regions 92P remain completely covered by dielectric material (e.g., the CESL 94), with the dielectric material being disposed between the conductive lines 118 and the front-sides of the epitaxial source/drain regions 92P. As discussed in greater detail below, the conductive lines 118 may be used for additional routing. For example, the conductive lines 118 may be used to route signals from an overlying interconnect structure (discussed in greater detail below).

The conductive lines 118 extend across multiple adjacent epitaxial source/drain regions 92P, and have portions over the STI regions 60 (e.g., between and adjacent to the epitaxial source/drain regions 92P). The portions of the conductive lines 118 over the STI regions 60 have a greater height than the portions of the conductive lines 118 over the epitaxial source/drain regions 92P. For example, the portions of the conductive lines 118 over the epitaxial source/drain regions 92P can have a height $H_1$ in the range of about 5 nm to about 30 nm, and the portions of the conductive lines 118 over the STI regions 60 can have a height $H_2$ in the range of about 50 nm to about 100 nm. Because the lower source/drain contacts 112 are formed through the CESL 94 but the conductive lines 118 are not, the lower source/drain contacts 112 thus have a greater height than the portions of the conductive lines 118 over the epitaxial source/drain regions 92P. For example, the lower source/drain contacts 112 can have a height $H_3$ in the range of about 10 nm to about 40 nm. The height $H_3$ is greater than the height $H_1$ and less than the height $H_2$.

FIG. 18 is a simplified view of a semiconductor device at a similar step of processing as the semiconductor device of FIGS. 17A through 17C, except more gate structures 100 are shown and some features are omitted for clarity of illustration. As shown, the lower source/drain contacts 112 are disposed over respective fins 54. The conductive lines 118 extend across multiple fins 54 (or across multiple groups of fins 54, when the adjacent epitaxial source/drain regions 92 of a same nano-FET have merged, as illustrated by FIG. 9C). Each of the conductive lines 118 can extend through only the n-type region 50N, only the p-type region 50P, or both the n-type region 50N and the p-type region 50P. The conductive lines 118 have a greater length than the lower source/drain contacts 112 in a direction that is parallel to the longitudinal axes of the gate structures 100. For example, the lower source/drain contacts 112 can have a length $L_1$ in the range of about 15 nm to about 50 nm, and the conductive lines 118 can have a length $L_2$ in the range of about 50 nm to about 150 nm. In some embodiments, the conductive lines 118 and the lower source/drain contacts 112 have the same widths in a direction that is parallel to the longitudinal axes of the fins 54. For example, the lower source/drain contacts 112 and the conductive lines 118 can each a width $W_1$ in the range of about 10 nm to about 30 nm.

In FIGS. 19A through 19D, a second ILD 122 is deposited over the first ILD 96, the gate electrodes 104, the lower source/drain contacts 112, and the conductive lines 118. The second ILD 122 may be formed of a material that is selected from the same group of candidate materials of the first ILD 96, and may be deposited using a method that is selected from the same group of candidate methods for depositing the first ILD 96. The first ILD 96 and the second ILD 122 may be formed from the same material, or may include different materials. After formation, the second ILD 122 can be planarized, such as by a CMP. In some embodiments, an etch stop layer is formed between the first ILD 96 and the second ILD 122. The etch stop layer may include a dielectric material, such as silicon nitride, silicon oxide, silicon oxynitride, or the like, having a different etch rate than the material of the second ILD 122.

Gate contacts 124, upper source/drain contacts 126, and line contacts 128 are then formed extending through the second ILD 122. Contact openings are formed through the second ILD 122. The contact openings may be formed using acceptable photolithography and etching techniques. A liner, such as a diffusion barrier layer, an adhesion layer, or the like, and a conductive material are then formed in the contact openings. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by ALD, CVD, PVD, or the like. A planarization process, such as a CMP, may be performed to remove excess material from the top surface of the second ILD 122. The remaining liner and conductive material in the contact openings forms the gate contacts 124, the upper source/drain contacts 126, and the line contacts 128. The gate contacts 124 are physically and electrically coupled to the gate electrodes 104. The upper source/drain contacts 126 are physically and electrically coupled to the lower source/drain contacts 112. The line contacts 128 are physically and electrically coupled to the conductive lines 118.

As will be discussed in greater detail below, a first interconnect structure (e.g., a front-side interconnect structure) will be formed over the substrate 50. Some or all of the substrate 50 will then be removed and replaced with a second interconnect structure (e.g., a back-side interconnect structure). Thus, a device layer 130 of active devices is formed between a front-side interconnect structure and a back-side interconnect structure. The front-side and back-side interconnect structures each comprise conductive features that are electrically connected to the nano-FETs of the device layer 130. The conductive features (e.g., metallization patterns, also referred to as interconnects) of the front-side interconnect structure will be electrically connected to front-sides of the epitaxial source/drain regions 92S and the gate electrodes 104 to form functional circuits, such as logic circuits, memory circuits, image sensor circuits, or the like. The conductive features (e.g., power rails) of the back-side interconnect structure will be electrically connected to back-sides of the epitaxial source/drain regions 92P to provide a reference voltage, supply voltage, or the like to the functional circuits. Although the device layer 130 is described as having nano-FETs, other embodiments may include a device layer 130 having a different type of transistor (e.g., planar FETs, FinFETs, TFTs, or the like).

Figure 25:
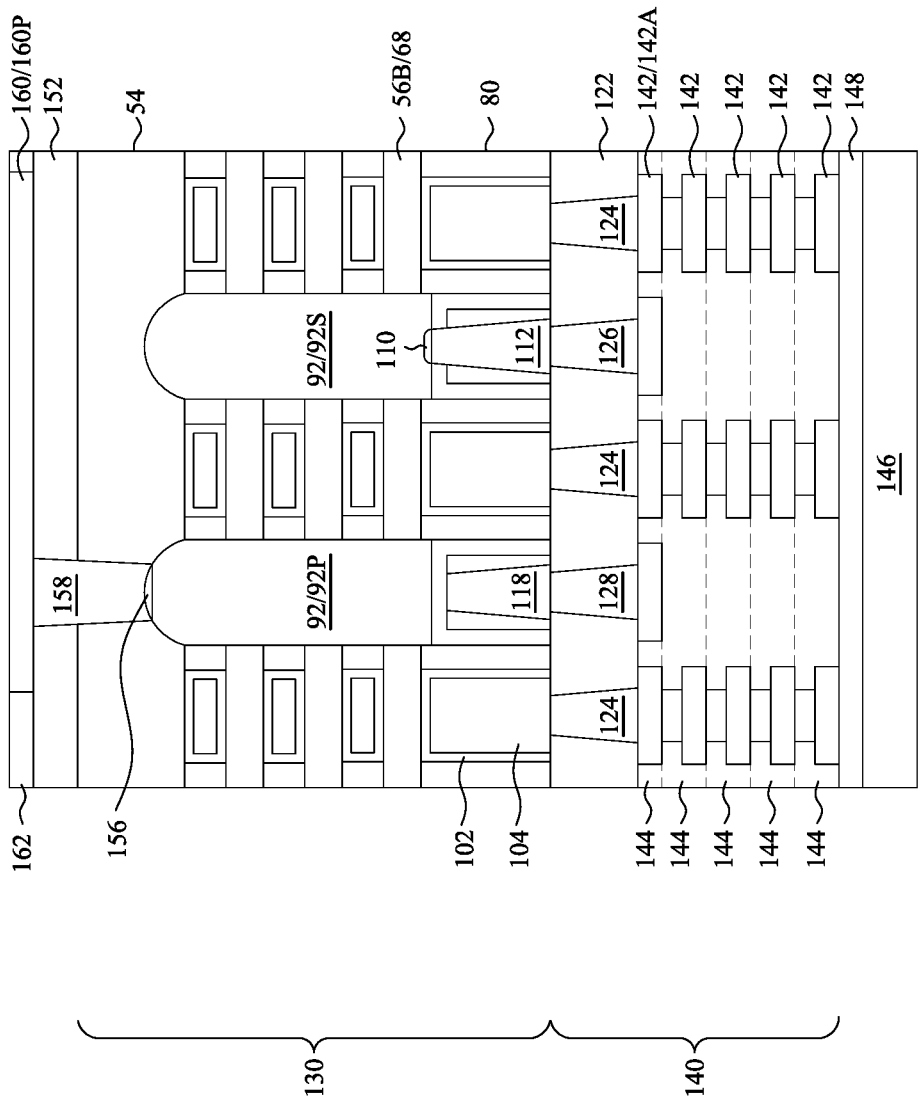
Figure 26:
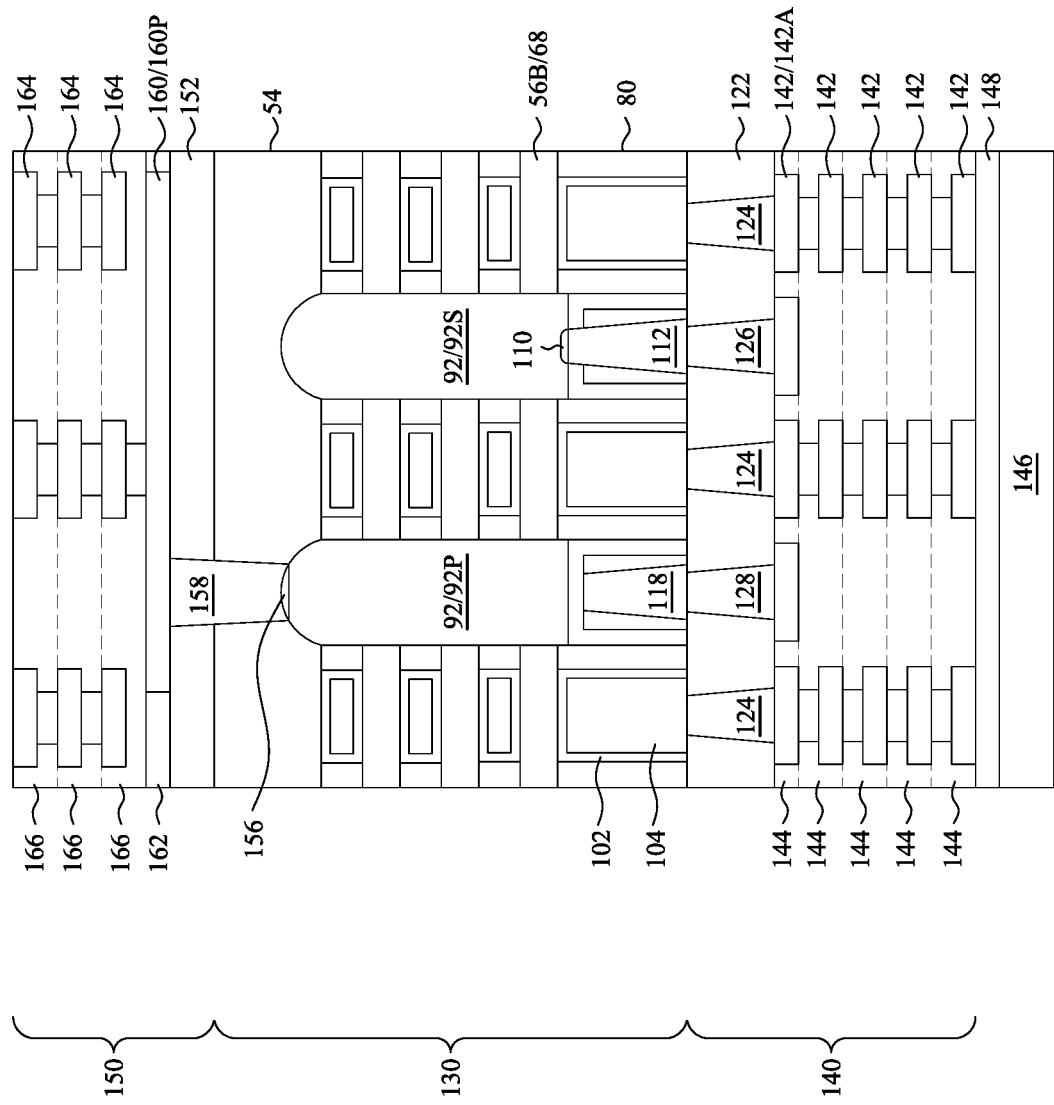
Figure 27A:
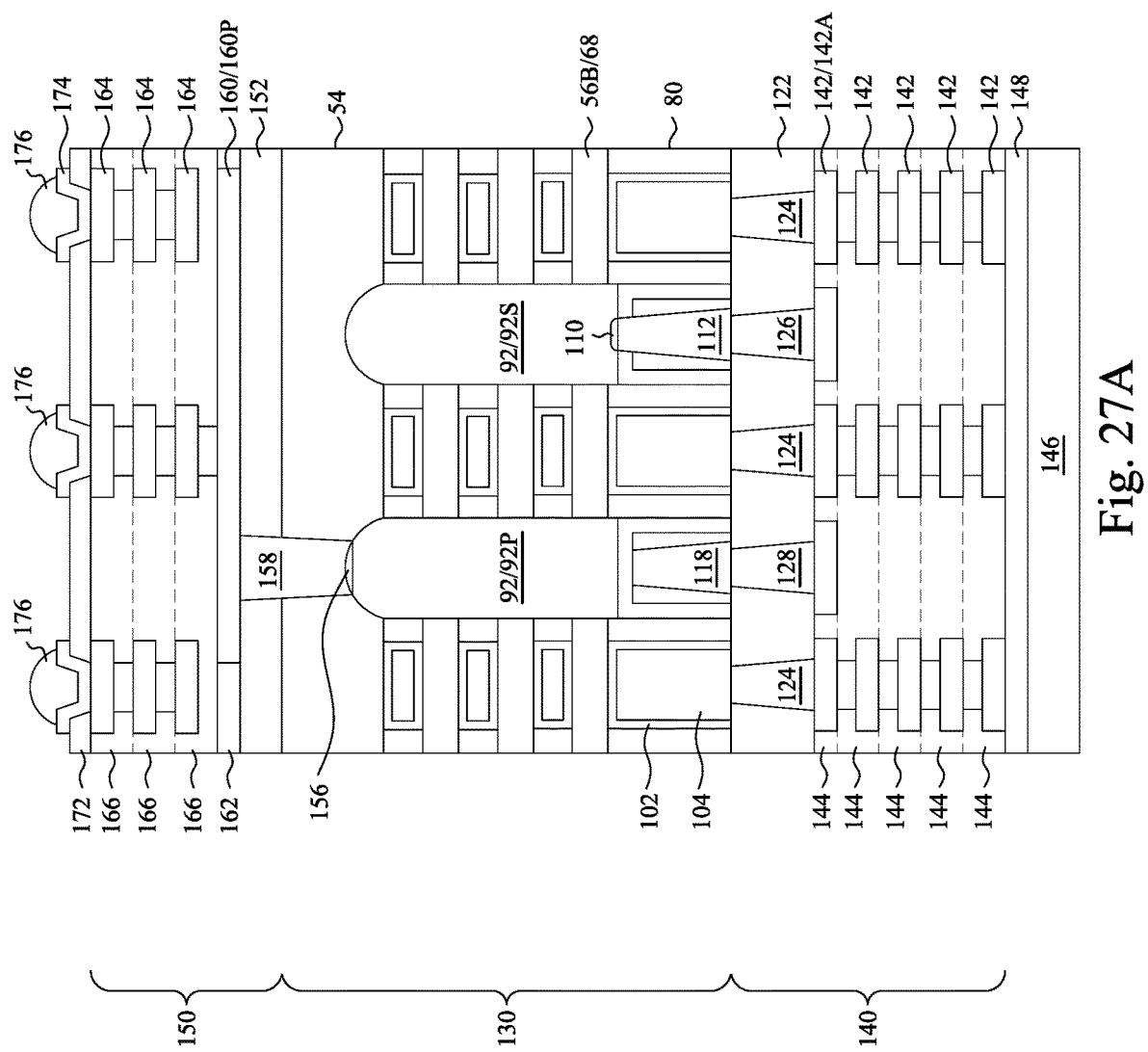
Figure 27B:
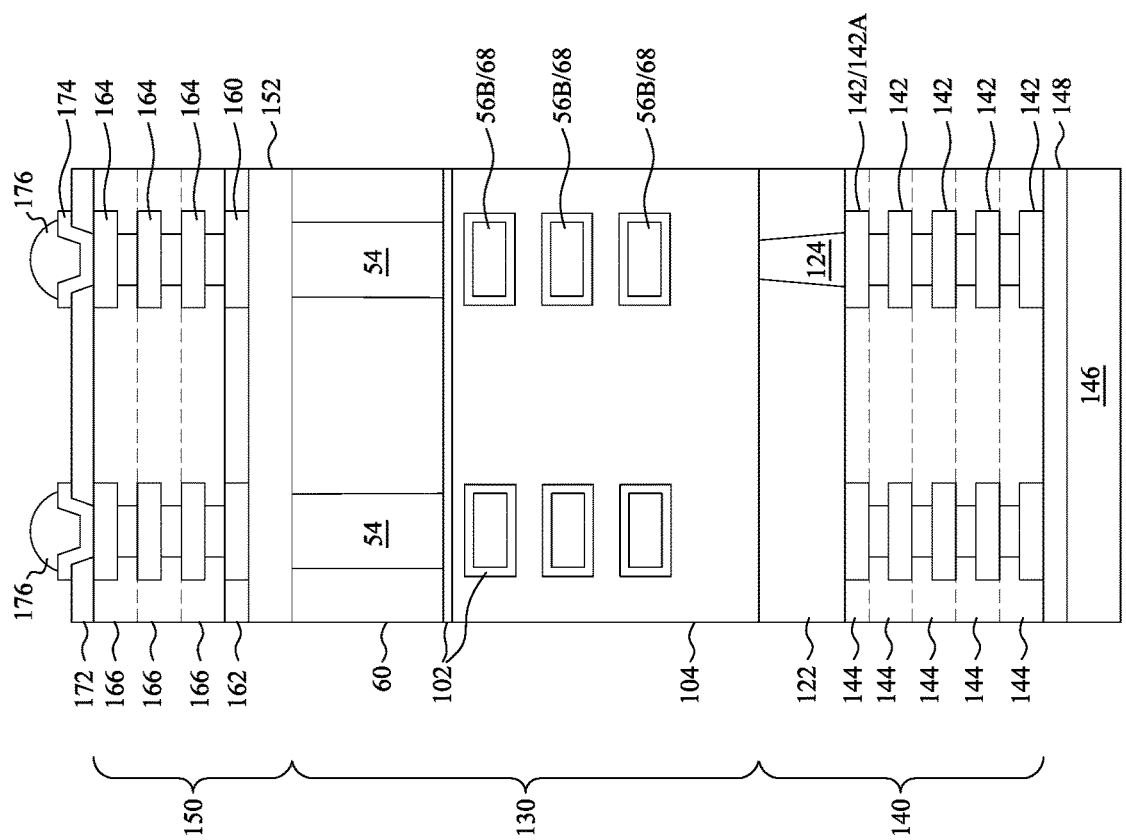
Figure 27C:
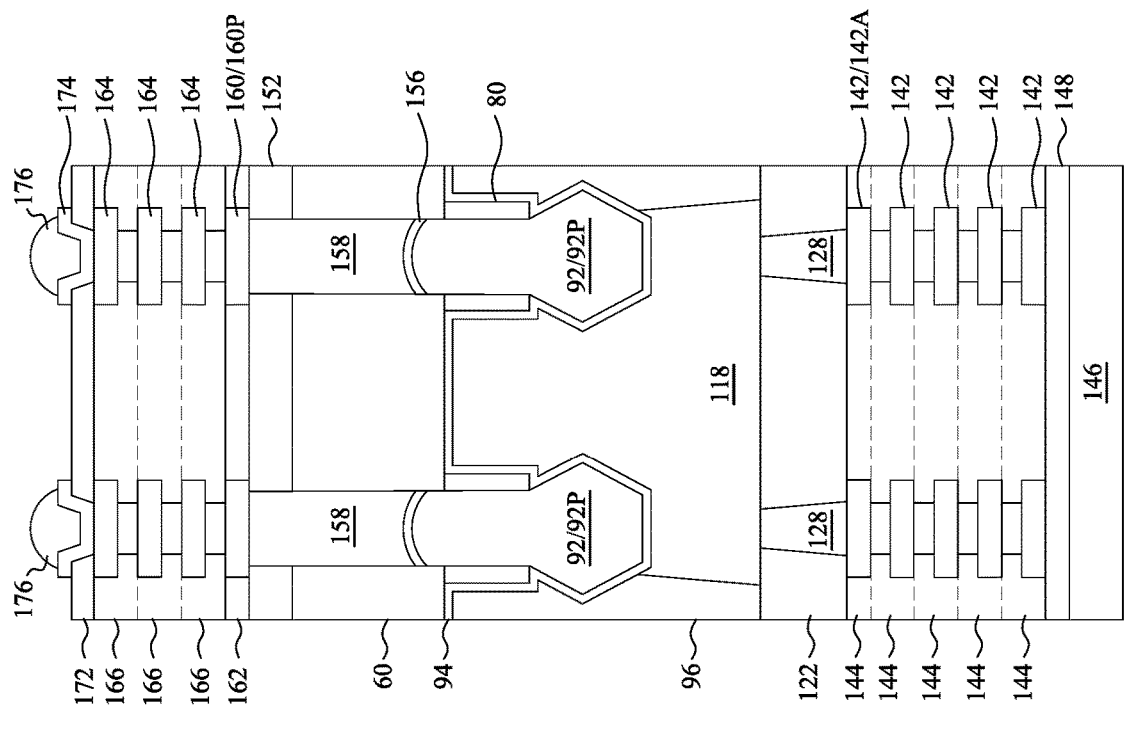
Figure 27D:
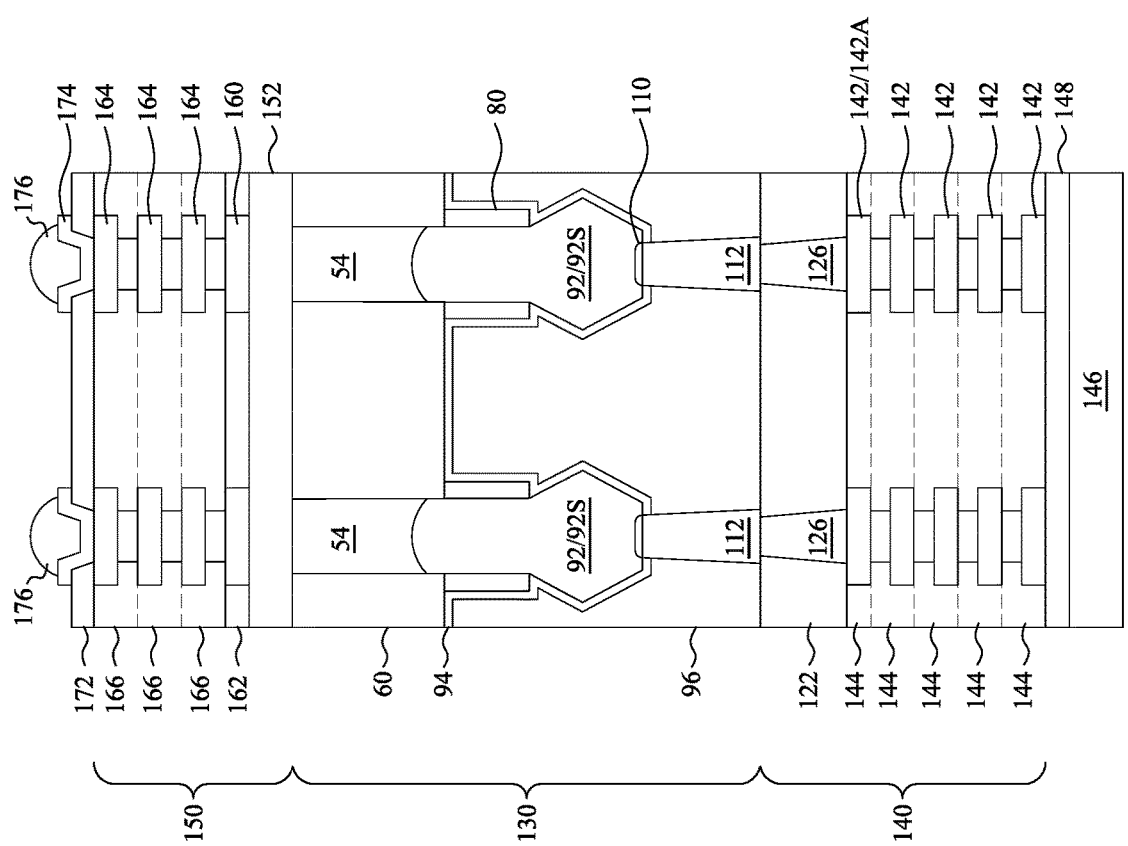
Figure 28A:
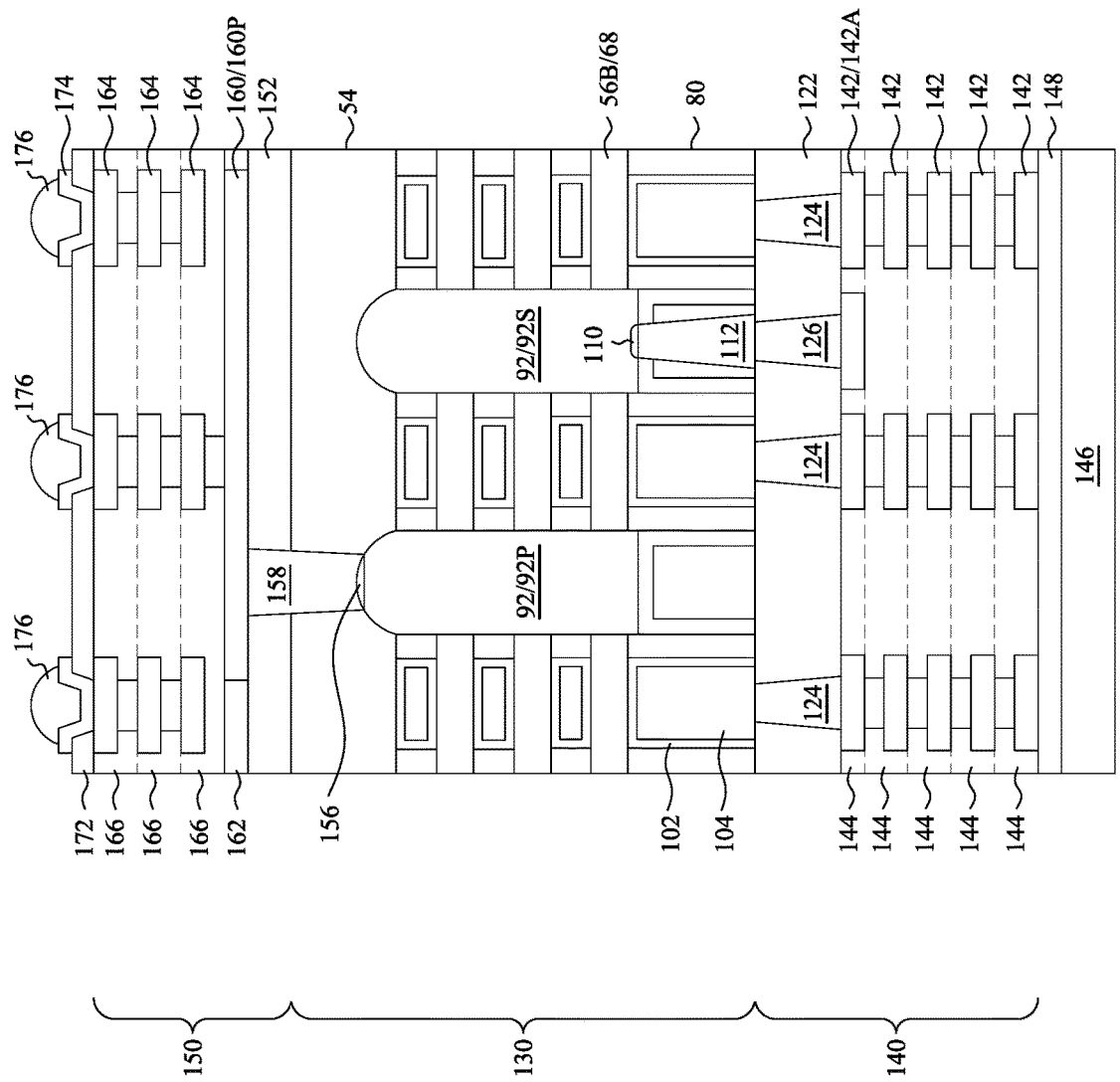
Figure 28C:
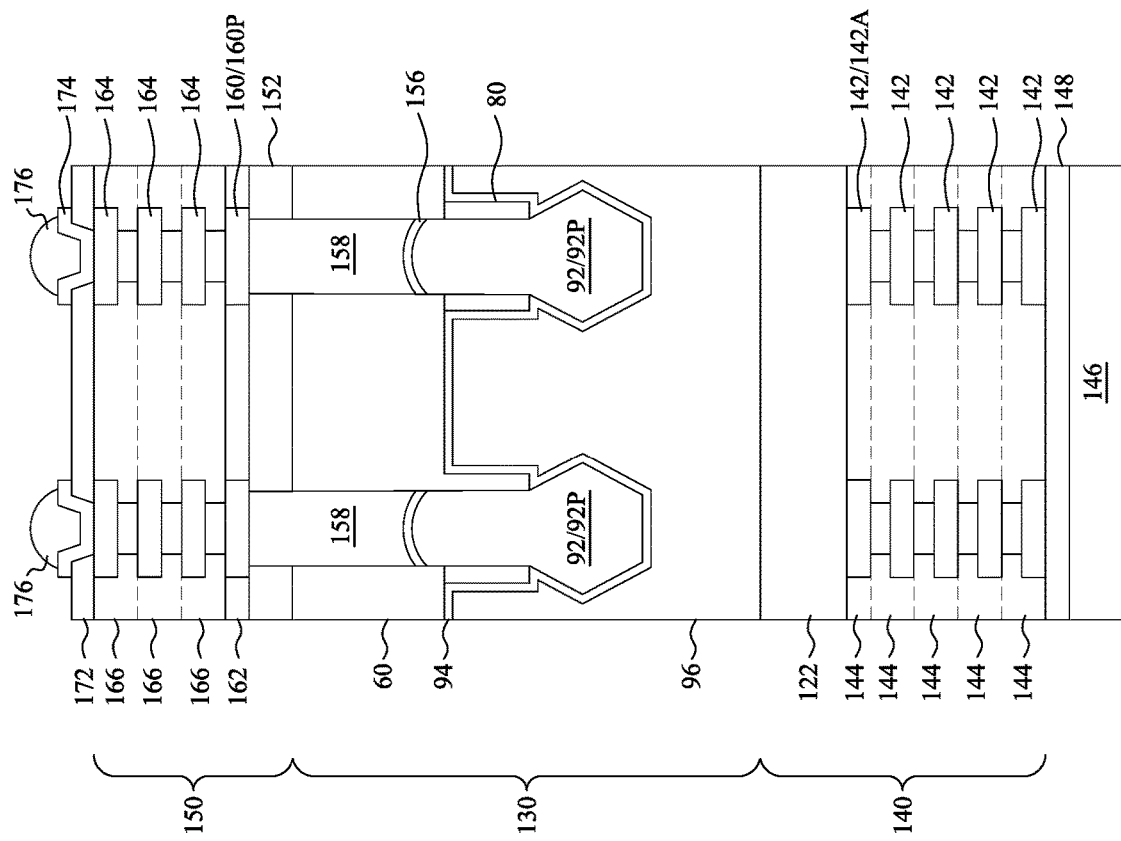
Figure 28D:
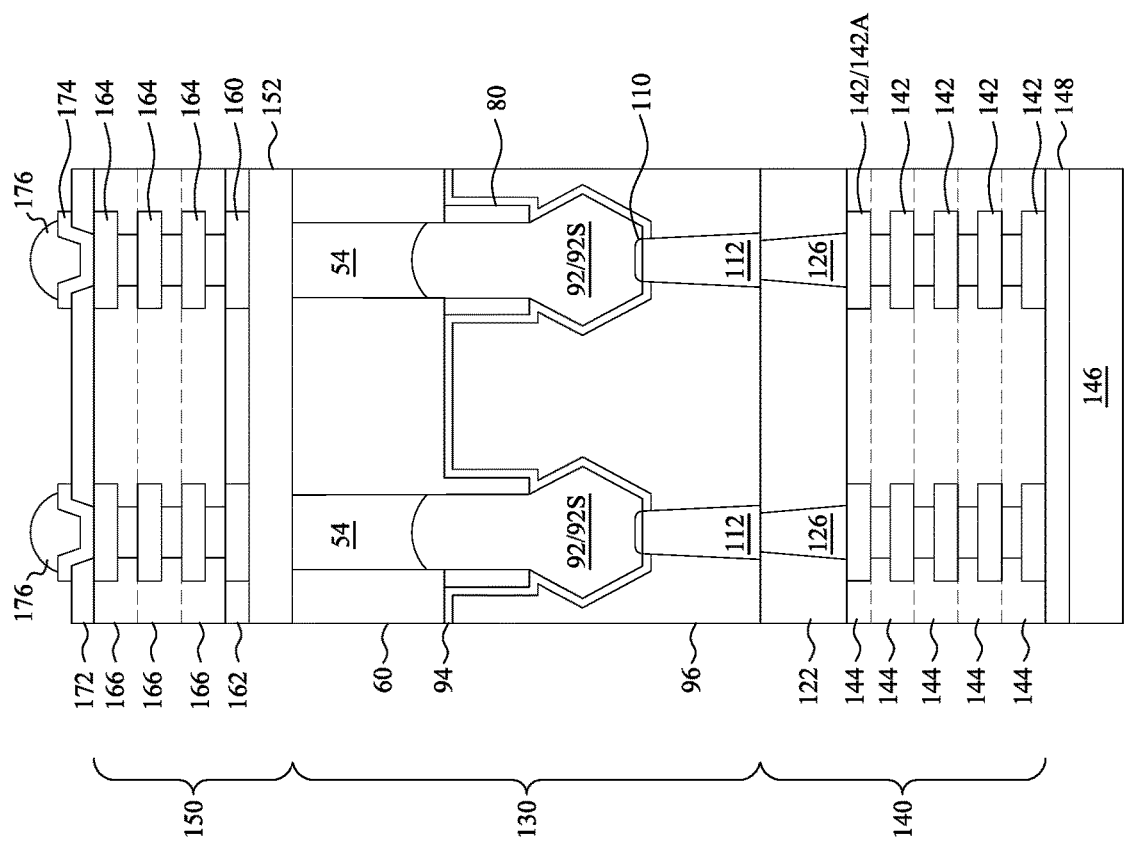

FIGS. 20 through 27D are various views of further intermediate stages in the manufacturing of semiconductor devices, in accordance with some embodiments. Specifically, the manufacturing of front-side and back-side interconnect structures for nano-FETs is illustrated. FIGS. 20, 21, 22, 23, 24, 25, 26, and 27A are cross-sectional views illustrated along reference cross-section A-A in FIG. 1. FIG. 27B is a cross-sectional view illustrated along reference cross-section B-B in FIG. 1. FIG. 27C is a cross-sectional view illustrated along reference cross-section C-C in FIG. 1, except two fins are shown. FIG. 27D is a cross-sectional view illustrated along reference cross-section D-D in FIG. 1, except two fins are shown.

Figure 20:
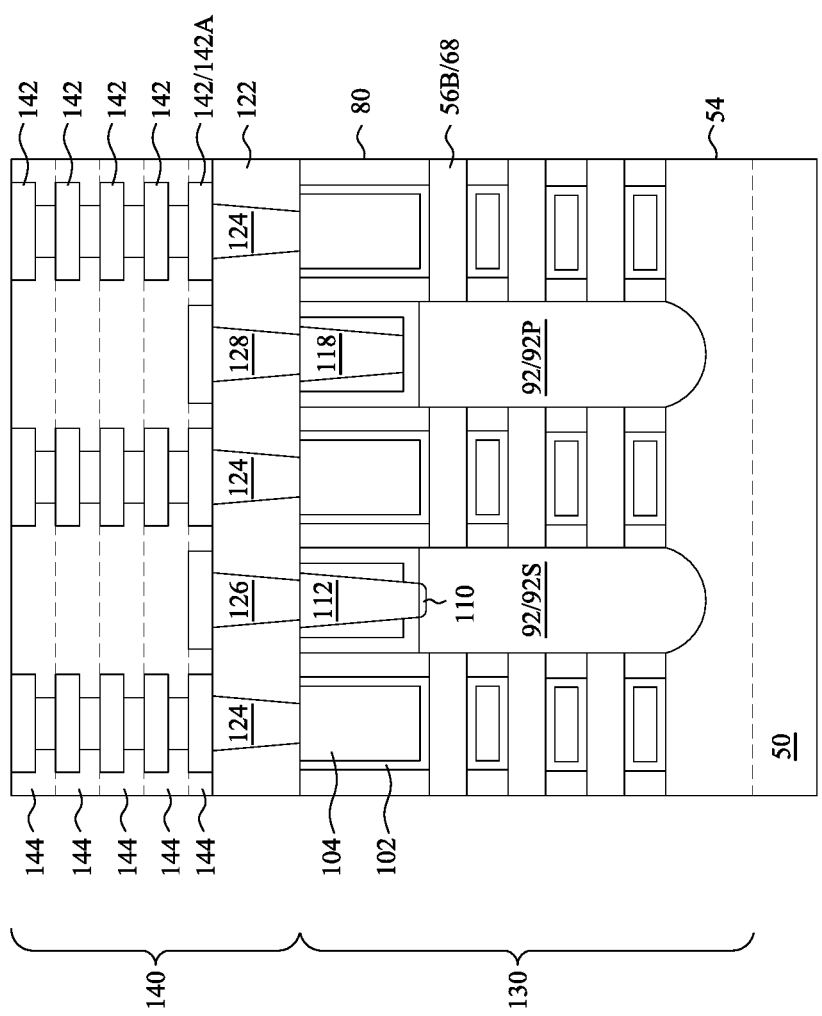
FIGS. 20 through 27D are various views of further intermediate stages in the manufacturing of semiconductor devices, in accordance with some embodiments.

In FIG. 20, an interconnect structure 140 is formed on the device layer 130, e.g., on the second ILD 122. The interconnect structure 140 may also be referred to as a front-side interconnect structure because it is formed at a front-side of the substrate 50/the device layer 130 (e.g., a side of the substrate 50 on which the device layer 130 is formed).

The interconnect structure 140 may comprise one or more layers of conductive features 142 formed in one or more stacked dielectric layers 144. Each of the dielectric layers 144 may comprise a dielectric material, such as a low-k dielectric material, an extra low-k (ELK) dielectric material, or the like. The dielectric layers 144 may be deposited using an appropriate process, such as, CVD, ALD, PVD, PECVD, or the like.

The conductive features 142 may comprise conductive lines and conductive vias interconnecting the layers of conductive lines. The conductive vias may extend through respective ones of the dielectric layers 144 to provide vertical connections between layers of conductive lines. The conductive features 142 may be formed through any acceptable process. For example, the conductive features 142 may be formed through a damascene process, such as a single damascene process, a dual damascene process, or the like. In a damascene process, a respective dielectric layer 144 is patterned utilizing a combination of photolithography and etching techniques to form trenches corresponding to the desired pattern of the conductive features 142. An optional diffusion barrier and/or optional adhesion layer may be deposited and the trenches may then be filled with a conductive material. Suitable materials for the barrier layer includes titanium, titanium nitride, titanium oxide, tantalum, tantalum nitride, or other alternatives, and suitable materials for the conductive material include copper, silver, gold, tungsten, aluminum, combinations thereof, or the like. In an embodiment, the conductive features 142 may be formed by depositing a seed layer of copper or a copper alloy, and filling the trenches by electroplating. A chemical mechanical planarization (CMP) process or the like may be used to remove excess conductive material from a surface of the respective dielectric layer 144 and to planarize the surface for subsequent processing.

In the illustrated example, five layers of conductive features 142 and dielectric layers 144 are illustrated. However, it should be appreciated that the interconnect structure 140 may comprise any number of conductive features disposed in any number of dielectric layers. The conductive features 142 of the interconnect structure 140 are electrically connected to the gate contacts 124, the upper source/drain contacts 126, and the line contacts 128 to form functional circuits. In other words, the conductive features 142 interconnect the conductive lines 118, the epitaxial source/drain regions 92, and the gate electrodes 104. In some embodiments, the functional circuits formed by the interconnect structure 140 may comprise logic circuits, memory circuits, image sensor circuits, or the like. The second ILD 122, the gate contacts 124, the upper source/drain contacts 126, and the line contacts 128 may also be considered part of the interconnect structure 140, such as part of a first level of conductive features of the interconnect structure 140.

As noted above, the conductive lines 118 may be used for additional routing. Thus, each of the conductive lines 118 are coupled to multiple line contacts 128 so that one conductive line 118 is connected to multiple conductive features 142 of the interconnect structure 140. The conductive lines 118 can act as additional interconnects for the interconnect structure 140. For example, a signal carrier by a first of the conductive features 142 may be routed down to a conductive line 118 and then routed back up to a second of the conductive features 142. Increased flexibility in signal routing may thus be achieved.

Figure 21:
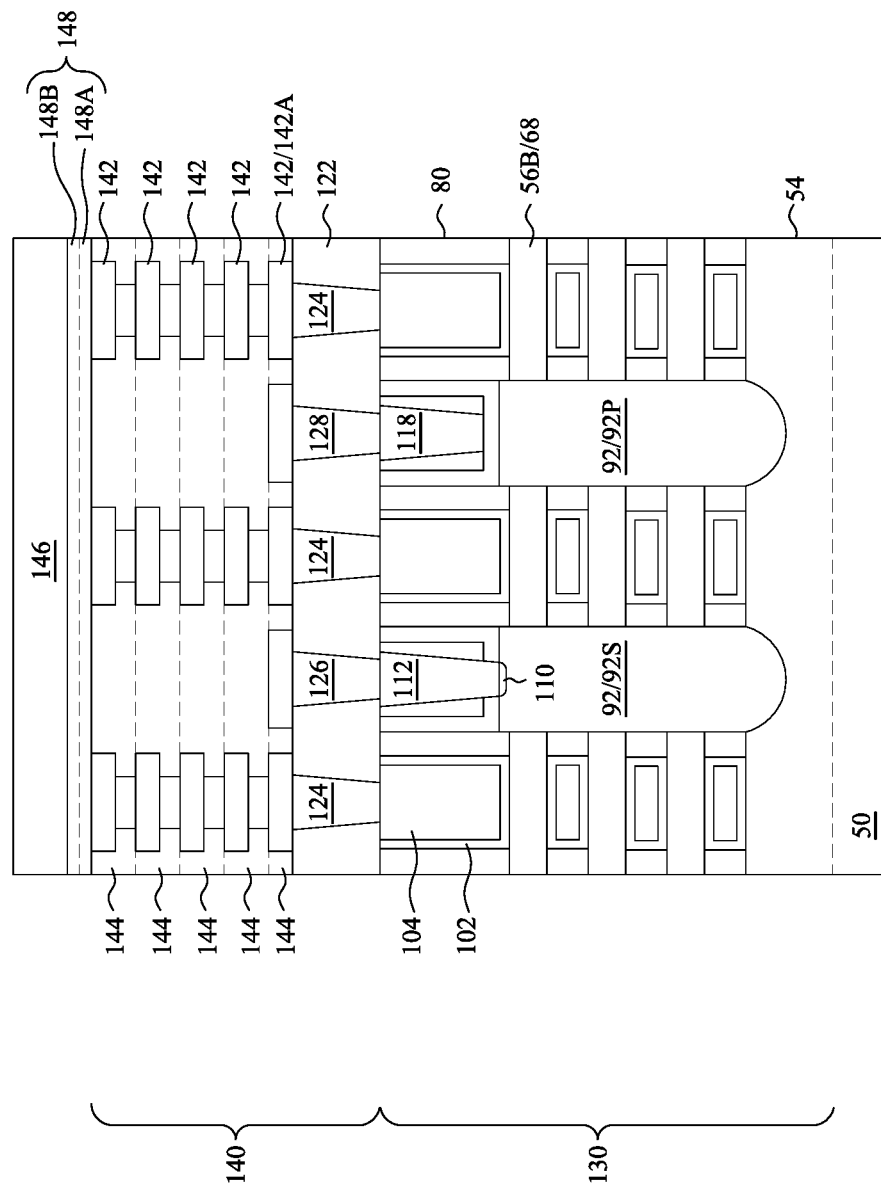

In FIG. 21, a carrier substrate 146 is bonded to a top surface of the interconnect structure 140 by bonding layers 148 (e.g., including bonding layers 148A, 148B). The carrier substrate 146 may be a glass carrier substrate, a ceramic carrier substrate, a semiconductor substrate (e.g., a silicon substrate), a wafer (e.g., a silicon wafer), or the like. The carrier substrate 146 may provide structural support during subsequent processing steps and in the completed device. The carrier substrate 146 be substantially free of any active or passive devices.

In various embodiments, the carrier substrate 146 may be bonded to the interconnect structure 140 using a suitable technique such as dielectric-to-dielectric bonding, or the like. Dielectric-to-dielectric bonding may comprise depositing the bonding layers 148A, 148B on the interconnect structure 140 and the carrier substrate 146, respectively. In some embodiments, the bonding layer 148A comprises silicon oxide (e.g., a high density plasma (HDP) oxide, or the like) that is deposited by CVD, ALD, PVD, or the like. The bonding layer 148B may likewise be an oxide layer that is formed prior to bonding using, for example, CVD, ALD, PVD, thermal oxidation, or the like. Other suitable materials may be used as well for the bonding layers 148A, 148B.

The dielectric-to-dielectric bonding process may further include applying a surface treatment to one or more of the bonding layers 148. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the bonding layers 148. The carrier substrate 146 is then aligned with the interconnect structure 140 and the two are pressed against each other to initiate a pre-bonding of the carrier substrate 146 to the interconnect structure 140. The pre-bonding may be performed at room temperature (e.g., in a range of about 20° C. to about 25° C.). After the pre-bonding, an annealing process may be applied by for example, heating the interconnect structure 140 and the carrier substrate 146 to a temperature of about 170° C.

Figure 22:
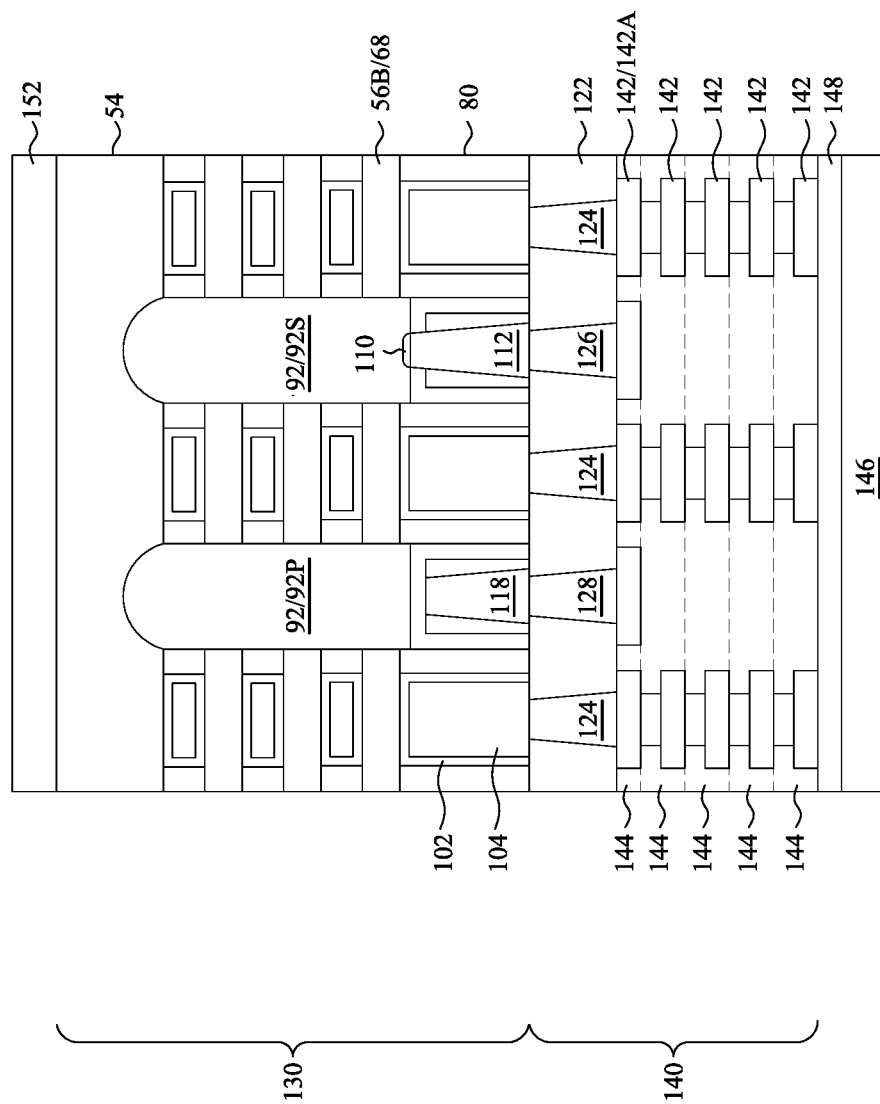

In FIG. 22, the intermediate structure is flipped so that the back-side of the substrate 50 faces upwards. The back-side of the substrate 50 refers to the side opposite to the front-side of the substrate 50 on which the device layer 130 is formed. The substrate 50 is then thinned to remove (or at least reduce the thickness of) the back-side portions of the substrate 50. The thinning process may comprise a planarization process (e.g., mechanical grinding, chemical mechanical polish (CMP), or the like), an etch back process, combinations thereof, or the like. The thinning process exposes the STI regions 60 and surfaces of the fins 54 at the back-side of the device layer 130.

A dielectric layer 152 is then deposited over the back-side of the device layer 130, such as over the fins 54 and the STI regions 60. The dielectric layer 152 is part of an interconnect structure formed on the device layer 130. The dielectric layer 152 may physically contact surfaces of the remaining portions of the fins 54 and the STI regions 60. The dielectric layer 152 may be formed of a material that is selected from the same group of candidate materials of the first ILD 96, and may be deposited using a method that is selected from the same group of candidate methods for depositing the first ILD 96. The first ILD 96 and the dielectric layer 152 may be formed from the same material, or may include different materials.

Figure 23:
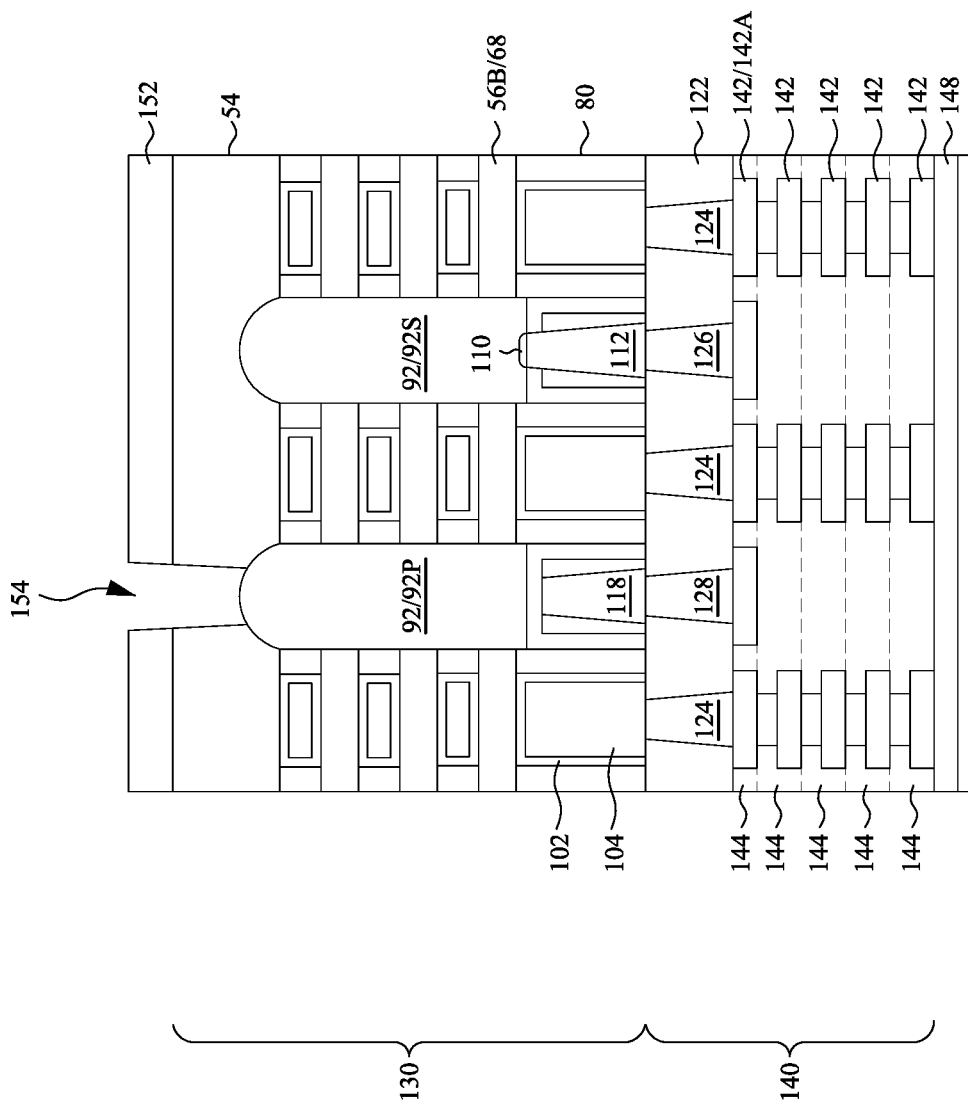

In FIG. 23, power rail contact openings 154 are formed through the dielectric layer 152, and the fins 54. The power rail contact openings 154 may be formed in the dielectric layer 152 using acceptable photolithography and etching techniques, such as with an etching process that is selective to the dielectric layer 152 (e.g., etches the material of the dielectric layer 152 at a faster rate than the material of the fins 54), using the mask 134 as an etching mask. For example, the power rail contact openings 154 may be initially formed through the dielectric layer 152 by a dry etch using ammonia ($NH_3$) and hydrogen fluoride (HF) gas. The power rail contact openings 154 are then extended through the fins 54 using acceptable photolithography and etching techniques, such as with an etching process that is selective to the fins 54 (e.g., etches the material of the fins 54 at a faster rate than the material of the epitaxial source/drain regions 92P). For example, the power rail contact openings 154 may be extended through the fins 54 by a dry etch using a fluorine-based gas such as hydrogen fluoride (HF) gas.

Figure 24:
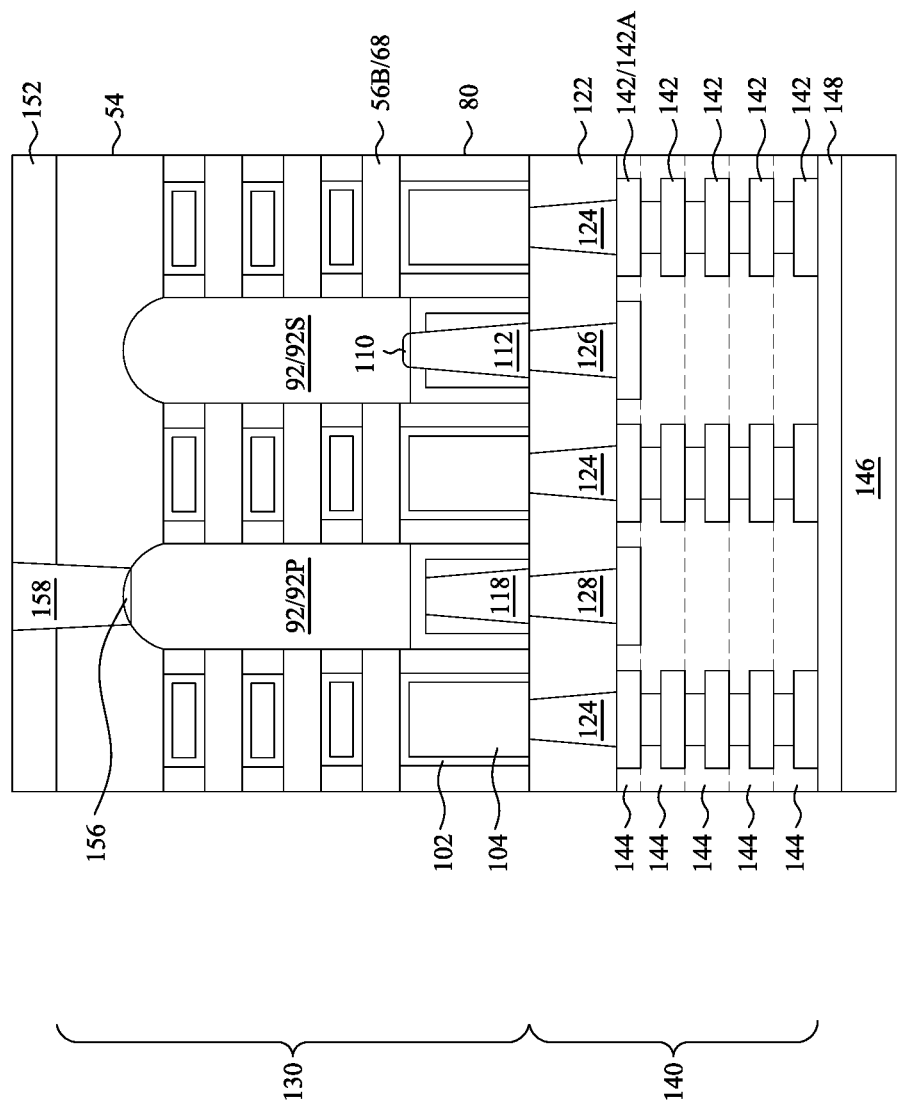

In FIG. 24, metal-semiconductor alloy regions 156 are optionally formed in the power rail contact openings 154, such as on portions of the epitaxial source/drain regions 92P exposed by the power rail contact openings 154. The metal-semiconductor alloy regions 156 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 156 can be formed by depositing a metal in the power rail contact openings 154 and then performing a thermal anneal process. The metal can be any metal capable of reacting with the semiconductor materials (e.g., silicon, silicon germanium, germanium, etc.) of the epitaxial source/drain regions 92P to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. In an embodiment, the metal-semiconductor alloy regions 156 are silicide regions formed of titanium-silicon. After the thermal anneal process, a cleaning process, such as a wet clean, may be performed to remove any residual metal from the power rail contact openings 154, such as from the top surfaces of the dielectric layer 152 and the STI regions 60.

Power rail contacts 158 are then formed in the power rail contact openings 154. A liner, such as a diffusion barrier layer, an adhesion layer, or the like, and a conductive material are formed in the power rail contact openings 154. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by ALD, CVD, PVD, or the like. A planarization process, such as a CMP, may be performed to remove excess material from the top surfaces of the dielectric layer 152 and the STI regions 60. The remaining liner and conductive material in the power rail contact openings 154 forms the power rail contacts 158. The power rail contacts 158 are physically and electrically coupled to the metal-semiconductor alloy regions 156 (if present) or the back-sides of the epitaxial source/drain regions 92P. The top surfaces of the power rail contacts 158, the dielectric layer 152, and the STI regions 60 are coplanar (within process variations).

In FIG. 25, conductive features 160 and a dielectric layer 162 are formed over the dielectric layer 152 and the power rail contacts 158. The dielectric layer 162 and conductive features 160 are also part of an interconnect structure formed on the device layer 130. The dielectric layer 162 may be formed of a material that is selected from the same group of candidate materials of the first ILD 96, and may be deposited using a method that is selected from the same group of candidate methods for depositing the first ILD 96. The first ILD 96 and the dielectric layer 162 may be formed from the same material, or may include different materials.

The conductive features 160 are formed in the dielectric layer 162, and may be conductive lines. Forming the conductive features 160 may include patterning recesses in the dielectric layer 162 using a combination of photolithography and etching processes. A pattern of the openings in the dielectric layer 162 may correspond to a pattern of the conductive features 160. The conductive features 160 are then formed by depositing a conductive material in the recesses. In some embodiments, the conductive features 160 comprises a metal layer, which may be a single layer or a composite layer comprising a plurality of sub-layers formed of different materials. In some embodiments, the conductive features 160 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, or the like. The material(s) of the conductive features 160 may be formed using, for example, CVD, ALD, PVD, plating or the like. The conductive features 160 are electrically connected to the epitaxial source/drain regions 92P through the metal-semiconductor alloy regions 156 (if present) and the power rail contacts 158. A planarization process (e.g., CMP, grinding, etch back, or the like) may be performed to remove excess portions of the conductive features 160 formed over the dielectric layer 162.

Some or all of the conductive features 160 are power rails 160P, which are conductive lines that electrically connect the epitaxial source/drain regions 92P to a reference voltage, supply voltage, or the like. By placing the power rails 160P at a back-side of the device layer 130 rather than at a front-side of the device layer 130, advantages may be achieved. For example, a gate density of the nano-FETs and/or interconnect density of the interconnect structure 140 may be increased. Further, the back-side of the device layer 130 may accommodate wider power rails, reducing resistance and increasing efficiency of power delivery to the nano-FETs. For example, a width of the conductive features 160 may be at least twice a width of a first level conductive line (e.g., conductive line 142A) of the interconnect structure 140.

In FIG. 26, remaining portions of an interconnect structure 150 are formed at the back-side of the device layer 130, such as over the dielectric layer 162 and the conductive features 160. The interconnect structure 150 may also be referred to as a back-side interconnect structure because it is formed on a back-side of the device layer 130. The remaining portions of the interconnect structure 150 may be similar to the interconnect structure 140. For example, the interconnect structure 150 may comprise similar materials and be formed using similar processes as the interconnect structure 140. In particular, the interconnect structure 150 may comprise stacked layers of conductive features 164 formed in stacked dielectric layers 166. The conductive features 164 may include routing lines (e.g., for routing to and from subsequently formed contact pads and external connectors).

The conductive features 164 may further include conductive vias that extend in the dielectric layers 166 to provide vertical interconnection between stacked layers of the conductive lines. The interconnect structure 150 thus includes the dielectric layers 152, 162, 166 and the conductive features 160, 164. The power rail contact 158 extends between the interconnect structure 150 and the device layer 130.

In some embodiments, the conductive features of the interconnect structure 150 may be patterned to include one or more embedded passive devices, such as resistors, capacitors, inductors, or the like. The embedded passive devices may be integrated with the conductive features 160, 164 (e.g., the power rails 160P) to provide circuits (e.g., power circuits) at the backside of the device layer 130.

In FIGS. 27A through 27D, a passivation layer 172, UBMs 174, and external connectors 176 are formed over the interconnect structure 150. The passivation layer 172 may comprise polymers such as polyimide, polybenzoxazole (PBO), a benzocyclobutene (BCB) based polymer, or the like. Alternatively, passivation layer 172 may include inorganic dielectric materials such as silicon oxide, silicon nitride, silicon carbide, silicon oxynitride, or the like. The material of the passivation layer 172 may be deposited by, for example, CVD, PVD, ALD, or the like.

The UBMs 174 are formed through the passivation layer 172 to the conductive features 164 of the interconnect structure 150, and the external connectors 176 are formed on the UBMs 174. The UBMs 174 may comprise one or more layers of copper, nickel, gold, or the like, which are formed by a plating process, or the like. The external connectors 176 (e.g., solder balls) are formed on the UBMs 174. The formation of external connectors 176 may include placing solder balls on the exposed portions of UBMs 174 and then reflowing the solder balls. In alternative embodiments, the formation of external connectors 176 includes performing a plating step to form solder regions over the topmost conductive feature 164 and then reflowing the solder regions. In another embodiment, the external connectors 176 are metal connectors with substantially vertical sidewalls, such as microbumps. The UBMs 174 and the external connectors 176 may be used to provide input/output connections to other electrical components, such as, other device dies, redistribution structures, printed circuit boards (PCBs), motherboards, or the like. The UBMs 174 and the external connectors 176 may also be referred to as backside input/output pads that may provide signal, reference voltage, supply voltage, and/or ground connections to the nano-FETs of the device layer 130.

FIGS. 28A through 28D are various views of semiconductor devices, in accordance with some other embodiments. This embodiment is similar to the embodiment of FIGS. 27A through 27D, except the conductive lines 118 and the line contacts 128 are omitted so that no conductive features are disposed in portions of the first ILD 96 over/under the epitaxial source/drain regions 92P. The conductive lines 118 and the line contacts 128 may be omitted when no additional routing is desired. Omitting the conductive lines 118 and the line contacts 128 can help further decrease the parasitic capacitance of the nano-FETs, allowing their performance to be improved.

Figure 29:
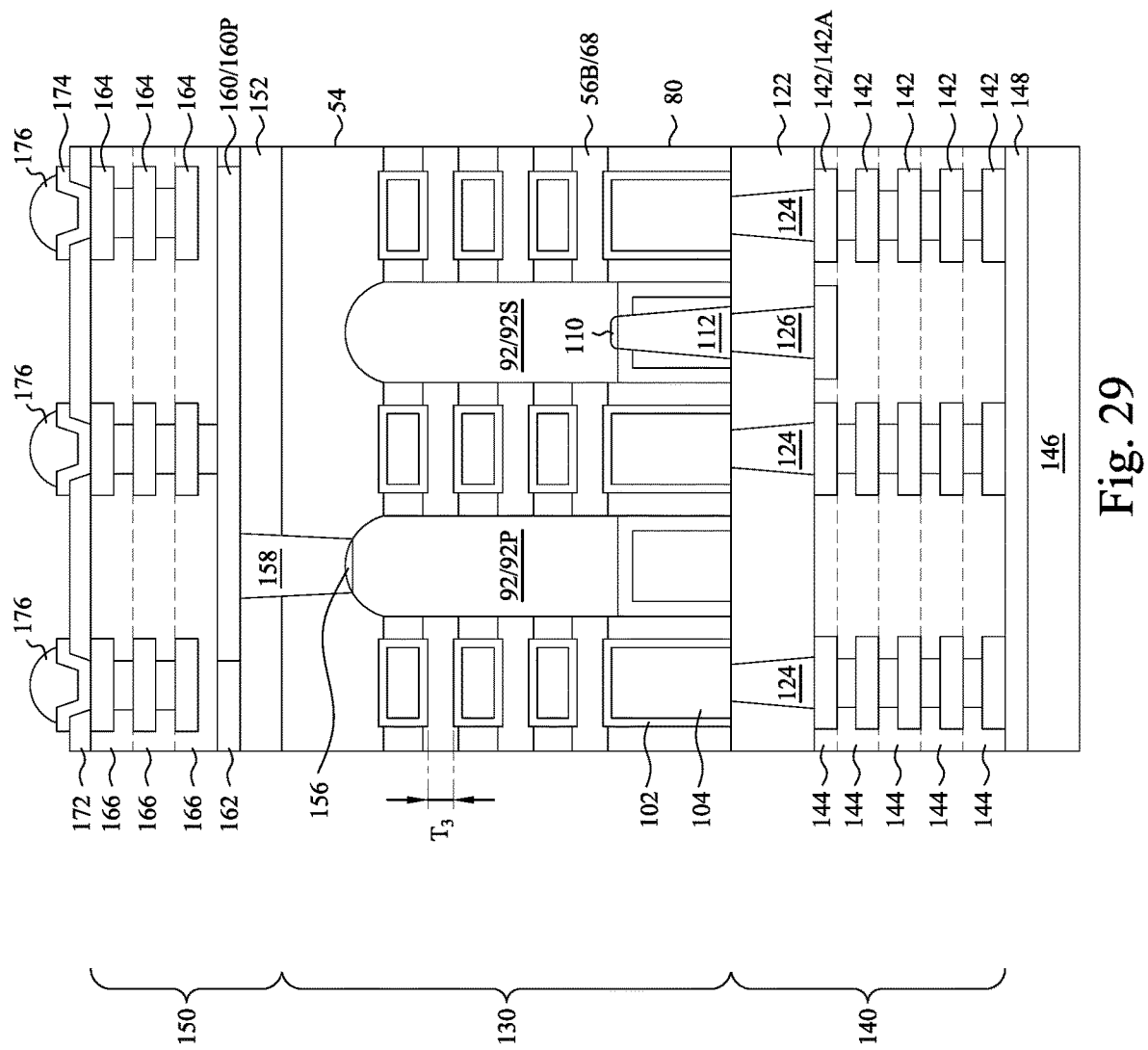
FIG. 29 is a cross-sectional view of semiconductor devices, in accordance with some other embodiments.

FIG. 29 is a cross-sectional view of semiconductor devices, in accordance with some other embodiments. This embodiment is similar to the embodiment of FIG. 27A, except the second nanostructures 56B are trimmed. The trimming reduces the thicknesses of the second nanostructures 56B from the second thickness $T_2$ (discussed above with respect to FIG. 2) to a third thickness $T_3$, with the third thickness $T_3$ being in a range of about 3 nm to about 8 nm, and the third thickness $T_3$ being from about 40% to about 70% less than the second thickness $T_2$. The trimming may be performed concurrently with the formation of the recesses 98 (discussed with respect to FIGS. 12A and 12B), or may be performed after the recesses 98 are formed. For example, the exposed portions of the second nanostructures 56B and the fins 54 may be trimmed by an acceptable etching process that selectively etches the material(s) of the second nanostructures 56B and the fins 54 at a faster rate than the materials of the first nanostructures 56A, the inner spacers 84, and the gate spacers 80. The etching may be isotropic. For example, when the fins 54 and the second nanostructures 56B are formed of silicon and the first nanostructures 56A are formed of silicon germanium, the etching process may be a wet etch using a diluted ammonium hydroxide-hydrogen peroxide mixture (APM), a sulfuric acid-hydrogen peroxide mixture (SPM), or the like.

Embodiments may achieve advantages. Because the power rails 160P are attached to the back-sides of the epitaxial source/drain regions 92P, contacts to the front-sides of the epitaxial source/drain regions 92P are undesired. Avoiding the formation of undesired contacts to the front-sides of the epitaxial source/drain regions 92P helps the resulting semiconductor devices not have contacts that are isolated and unused. The parasitic capacitance of the nanoFETs of the device layer 130 may thus be reduced, increasing their performance. Further, avoiding the formation of such contacts frees up room in the first ILD 96 that may be used for other purposes. For example, the conductive lines 118 may be formed and used for additional interconnect routing. Increased flexibility in signal routing may thus be achieved.

In an embodiment, a device includes: a first fin; a gate structure over the first fin; a first source/drain region adjacent the gate structure; an etch stop layer over the first source/drain region; a conductive line over the etch stop layer, the conductive line isolated from the first source/drain region by the etch stop layer, a top surface of the conductive line being coplanar with a top surface of the gate structure; and a power rail contact extending through the first fin, the power rail contact connected to the first source/drain region. In some embodiments, the device further includes: a second source/drain region adjacent the gate structure, the etch stop layer disposed over the second source/drain region; and a source/drain contact extending through the etch stop layer, the source/drain contact connected to the second source/drain region, a top surface of the source/drain contact being coplanar with the top surface of the conductive line and the top surface of the gate structure. In some embodiments, the device further includes: dielectric layers over the gate structure and the conductive line; and interconnects in the dielectric layers, the interconnects interconnecting the conductive line, the source/drain contact, and the gate structure. In some embodiments of the device, the conductive line has a first portion and a second portion, the first portion disposed over the first source/drain region, the second portion disposed adjacent the first source/drain region. In some embodiments of the device, the first portion of the conductive line has a first height, the second portion of the conductive line has a second height, and the source/drain contact has a third height, the third height being greater than the first height and less than the second height. In some embodiments of the device, the conductive line has a first length, the source/drain contact has a second length, and the first length is greater than the second length, each of the first length and the second length measured in a direction that is parallel to a longitudinal axis of the gate structure. In some embodiments of the device, the conductive line has a first width and the source/drain contact has the first width, the first width measured in a direction that is parallel to a longitudinal axis of the first fin. In some embodiments, the device further includes: a second fin, the gate structure over the second fin; and a second source/drain region adjacent the gate structure and in the second fin, the etch stop layer disposed over the second source/drain region, the conductive line extending across the first source/drain region and the second source/drain region. In some embodiments, the device further includes: a nanostructure over the first fin, the gate structure surrounding the nanostructure.

In an embodiment, a device includes: a back-side interconnect structure including a power rail; a front-side interconnect structure including interconnects; and a device layer between the back-side interconnect structure and the front-side interconnect structure, the device layer including a transistor including: a first epitaxial source/drain region; a source/drain contact contacting a front-side of the first epitaxial source/drain region, the interconnects connected to the source/drain contact; a second epitaxial source/drain region; and a power rail contact contacting a back-side of the second epitaxial source/drain region, the power rail connected to the power rail contact, a front-side of the second epitaxial source/drain region being completely covered by dielectric material. In some embodiments of the device, the device layer further includes: a conductive line, the dielectric material disposed between the conductive line and the front-side of the second epitaxial source/drain region, surfaces of the conductive line and the source/drain contact being coplanar. In some embodiments of the device, the conductive line and the source/drain contact have a same width in a first direction, and the conductive line has a greater length than the source/drain contact in a second direction, the second direction perpendicular to the first direction. In some embodiments of the device, the front-side interconnect structure further includes: a plurality of line contacts contacting the conductive line, the interconnects connected to the line contacts. In some embodiments of the device, the interconnects include a conductive line, a width of the power rail being greater than a width of the conductive line.

In an embodiment, a method includes: depositing an etch stop layer on a first epitaxial source/drain region, a second epitaxial source/drain region, and a gate structure, the first epitaxial source/drain region and the second epitaxial source/drain region disposed at opposing sides of the gate structure; depositing an interlayer dielectric (ILD) on the etch stop layer; etching a first opening through the ILD and the etch stop layer, the first opening exposing a front-side of the first epitaxial source/drain region, a front-side of the second epitaxial source/drain region remaining covered by the etch stop layer after etching the first opening; and forming a source/drain contact in the first opening, the source/drain contact contacting the first epitaxial source/drain region.

In some embodiments of the method, etching the first opening includes: patterning a mask over the ILD, the mask having a pattern of openings over the first epitaxial source/drain region and the second epitaxial source/drain region; after the patterning, covering a portion of the pattern of openings over the second epitaxial source/drain region; and after the covering, etching the ILD and the etch stop layer using the mask as an etching mask. In some embodiments of the method, etching the first opening includes: patterning a mask over the ILD, the mask having a pattern of openings over the first epitaxial source/drain region but not the second epitaxial source/drain region; and after the patterning, etching the ILD and the etch stop layer using the mask as an etching mask. In some embodiments, the method further includes: etching a second opening through the ILD, the second opening exposing the etch stop layer; and forming a conductive line in the second opening, the conductive line contacting the etch stop layer. In some embodiments of the method, etching the first opening includes etching the ILD with first etching process parameters and etching the etch stop layer with second etching process parameters, the second etching process parameters being different from the first etching process parameters. In some embodiments of the method, etching the second opening includes etching the ILD with the first etching process parameters and does not include etching the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first nanostructure;
a gate structure wrapped around the first nanostructure;
a first source/drain region adjacent the gate structure;
a first dielectric layer over the first source/drain region;
an interlayer dielectric over the first dielectric layer, a material of the interlayer dielectric being different than a material of the first dielectric layer; and
a conductive line extending through the interlayer dielectric, the conductive line disposed over the first source/drain region, the conductive line isolated from the first source/drain region by the first dielectric layer, a top surface of the conductive line being coplanar with a top surface of the gate structure.

2. The device of claim 1, further comprising:
a second nanostructure; and
a second source/drain region adjacent the second nanostructure, the first dielectric layer disposed over the second source/drain region, the conductive line extending across the first source/drain region and the second source/drain region in a top-down view.

3. The device of claim 2, wherein the conductive line has a first length as it extends across the first source/drain region and the second source/drain region in the top-down view, the conductive line has a first width in the top-down view, and the first length is greater than the first width.

4. The device of claim 1, further comprising:
a second source/drain region adjacent the gate structure on an opposite side from the first source/drain region, the first dielectric layer disposed over the second source/drain region; and
a source/drain contact extending through the interlayer dielectric and the first dielectric layer, the source/drain contact connected to the second source/drain region.

5. The device of claim 4, wherein the source/drain contact and the conductive line have a same width.

6. The device of claim 1, further comprising:
a second dielectric layer under the first source/drain region; and
a power rail contact extending through the second dielectric layer, the power rail contact connected to the first source/drain region.

7. The device of claim 1, further comprising:
dielectric layers over the gate structure and the conductive line; and
interconnects in the dielectric layers, the interconnects connected to the conductive line and the gate structure.

8. A device comprising:
a back-side interconnect structure comprising a power rail;
a front-side interconnect structure comprising a first interconnect; and
a device layer between the back-side interconnect structure and the front-side interconnect structure, the device layer comprising:
a transistor comprising a source/drain region;
a power rail contact contacting a back-side of the source/drain region, the power rail connected to the power rail contact;
a dielectric material completely covering a front-side of the source/drain region; and
a conductive line on the dielectric material, the first interconnect connected to the conductive line.

9. The device of claim 8, wherein the front-side interconnect structure further comprises a second interconnect, the second interconnect connected to the conductive line.

10. The device of claim 8, wherein a width of the power rail is greater than a width of the first interconnect.

11. The device of claim 10, wherein the first interconnect is a first level conductive line of the front-side interconnect structure.

12. The device of claim 8, wherein the transistor further comprises a gate structure and a surface of the conductive line is coplanar with a surface of the gate structure.

13. The device of claim 8, wherein the back-side interconnect structure further comprises a passive device, the power rail connected to the passive device.

14. The device of claim 8, further comprising:
a support substrate attached to the front-side interconnect structure; and
an external connector connected to the power rail.

15. A device comprising:
a first dielectric layer;
a nanostructure over the first dielectric layer;
a gate structure wrapped around the nanostructure;
a first spacer adjacent the gate structure;
a first source/drain region adjacent the first spacer and the nanostructure;
a second dielectric layer completely covering a front-side of the first source/drain region; and
a power rail contact extending through the first dielectric layer, the power rail contact connected to a back-side of the first source/drain region.

16. The device of claim 15, further comprising:
a fin between the first dielectric layer and the nanostructure, the power rail contact extending through the fin.

17. The device of claim 15, further comprising:
a second spacer adjacent the gate structure on an opposite side from the first spacer;
a second source/drain region adjacent the second spacer and the nanostructure, the second dielectric layer disposed over a front-side of the second source/drain region; and a source/drain contact extending through the second dielectric layer, the source/drain contact connected to the front-side of the second source/drain region.

18. The device of claim 17, wherein a surface of the source/drain contact is coplanar with a surface of the gate structure.

19. The device of claim 18, wherein the surface of the gate structure is coplanar with a surface of the first spacer and a surface of the second spacer.

20. The device of claim 15, further comprising:
a conductive line on the second dielectric layer.

* * * * *